(12) United States Patent
Dell et al.

(10) Patent No.: US 7,721,140 B2
(45) Date of Patent: May 18, 2010

(54) SYSTEMS AND METHODS FOR IMPROVING SERVICEABILITY OF A MEMORY SYSTEM

(75) Inventors: Timothy J. Dell, Colchester, VT (US);
Luis A. Lastras-Montano, Cortlandt Manor, NY (US)

(73) Assignee: International Business Machines Corporation, Armonk, NY (US)

(*) Notice: Subject to any disclaimer, the term of this patent is extended or adjusted under 35 U.S.C. 154(b) by 568 days.

(21) Appl. No.: 11/619,038

(22) Filed: Jan. 2, 2007

(65) Prior Publication Data
US 2008/0162991 A1 Jul. 3, 2008

(51) Int. Cl.
*G06F 11/00* (2006.01)

(52) U.S. Cl. .................. 714/5; 714/42; 714/54

(58) Field of Classification Search ............ 714/5, 714/42, 54, 723
See application file for complete search history.

(56) References Cited

U.S. PATENT DOCUMENTS

| | | | |
|---|---|---|---|
| 2,842,682 A | 7/1958 | Clapper | |
| 3,333,253 A | 7/1967 | Sahulka | |
| 3,395,400 A | 7/1968 | De Witt | |
| 3,825,904 A | 7/1974 | Burk et al. | 340/172.5 |
| 4,028,675 A | 6/1977 | Frankenberg | 711/106 |
| 4,135,240 A | 1/1979 | Ritchie | |
| 4,150,428 A | 4/1979 | Inrig et al. | |
| 4,472,780 A | 9/1984 | Chenoweth et al. | |
| 4,475,194 A | 10/1984 | LaVallee et al. | 371/10 |
| 4,479,214 A * | 10/1984 | Ryan | 714/702 |
| 4,486,739 A | 12/1984 | Franaszek et al. | 340/347 |
| 4,641,263 A | 2/1987 | Perlman et al. | |
| 4,654,857 A | 3/1987 | Samson et al. | |
| 4,723,120 A | 2/1988 | Petty, Jr. | 340/825.02 |
| 4,740,916 A | 4/1988 | Martin | 364/900 |
| 4,782,487 A * | 11/1988 | Smelser | 714/723 |
| 4,796,231 A | 1/1989 | Pinkham | 365/189.05 |
| 4,803,485 A | 2/1989 | Rypinkski | 370/452 |

(Continued)

FOREIGN PATENT DOCUMENTS

EP 0229316 A2 7/1987

(Continued)

OTHER PUBLICATIONS

PCT Search Report. PCT/EP2007/057915. Mailed Nov. 7, 2007.

(Continued)

*Primary Examiner*—Michael C Maskulinski
*Assistant Examiner*—Joshua P Lottich
(74) *Attorney, Agent, or Firm*—Cantor Colburn LLP

(57) ABSTRACT

Systems and methods for improving serviceability of a memory system including a method for identifying a failing memory element in a memory system when two or more modules operate in unison in response to a read request. The method includes receiving syndrome bits and an address associated with an uncorrectable error (UE). In response to a previous correctable error (CE) having occurred, the location of the previous CE is retrieved. The location of the CE specifies a memory device position of the CE. A location of the UE is determined using the location of the previous CE and the syndrome bits of the UE as input. The location of the UE specified a memory device position. A failing memory element associated with the location of the UE is identified.

20 Claims, 13 Drawing Sheets

U.S. PATENT DOCUMENTS

| | | | |
|---|---|---|---|
| 4,833,605 A | 5/1989 | Terada et al. | 364/200 |
| 4,839,534 A | 6/1989 | Clasen | 307/269 |
| 4,943,984 A | 7/1990 | Pechanek et al. | 375/109 |
| 4,964,129 A * | 10/1990 | Bowden et al. | 714/764 |
| 4,964,130 A * | 10/1990 | Bowden et al. | 714/764 |
| 4,985,828 A | 1/1991 | Shimizu et al. | 364/200 |
| 5,053,947 A | 10/1991 | Heibel et al. | 364/200 |
| 5,177,375 A | 1/1993 | Ogawa et al. | |
| 5,206,946 A | 4/1993 | Brunk | 710/2 |
| 5,214,747 A | 5/1993 | Cok | 395/27 |
| 5,265,049 A | 11/1993 | Takasugi | |
| 5,265,212 A | 11/1993 | Bruce, II | 710/113 |
| 5,287,531 A | 2/1994 | Rogers, Jr. et al. | 395/800 |
| 5,347,270 A | 9/1994 | Matsuda et al. | 340/2.21 |
| 5,357,621 A | 10/1994 | Cox | |
| 5,375,127 A | 12/1994 | Leak | |
| 5,387,911 A | 2/1995 | Gleichert et al. | 341/95 |
| 5,394,535 A | 2/1995 | Ohuchi | 711/155 |
| 5,410,545 A * | 4/1995 | Porter et al. | 714/723 |
| 5,454,091 A | 9/1995 | Sites et al. | 395/413 |
| 5,475,690 A | 12/1995 | Burns et al. | 370/105.3 |
| 5,513,135 A | 4/1996 | Dell et al. | 365/52 |
| 5,517,626 A | 5/1996 | Archer et al. | |
| 5,522,064 A | 5/1996 | Aldereguia et al. | |
| 5,544,309 A | 8/1996 | Chang et al. | |
| 5,546,023 A | 8/1996 | Borkar et al. | |
| 5,561,826 A | 10/1996 | Davies et al. | |
| 5,592,632 A | 1/1997 | Leung et al. | 395/306 |
| 5,594,925 A | 1/1997 | Harder et al. | |
| 5,611,055 A | 3/1997 | Krishan et al. | 395/281 |
| 5,613,077 A | 3/1997 | Leung et al. | 395/306 |
| 5,627,963 A | 5/1997 | Gabillard et al. | 714/42 |
| 5,629,685 A | 5/1997 | Allen et al. | 340/825.02 |
| 5,661,677 A | 8/1997 | Rondeau, II et al. | 365/63 |
| 5,666,480 A | 9/1997 | Leung et al. | 395/180 |
| 5,684,418 A | 11/1997 | Yanagiuchi | |
| 5,706,346 A | 1/1998 | Katta et al. | |
| 5,737,589 A | 4/1998 | Doi et al. | |
| 5,754,804 A | 5/1998 | Cheselka et al. | |
| 5,764,155 A | 6/1998 | Kertesz et al. | 340/825.08 |
| 5,822,749 A | 10/1998 | Agarwal | 707/2 |
| 5,852,617 A | 12/1998 | Mote, Jr. | 714/726 |
| 5,870,320 A | 2/1999 | Volkonsky | |
| 5,870,325 A | 2/1999 | Nielsen et al. | 365/63 |
| 5,872,996 A | 2/1999 | Barth et al. | 395/853 |
| 5,881,154 A | 3/1999 | Nohara et al. | |
| 5,917,760 A | 6/1999 | Millar | |
| 5,926,838 A | 7/1999 | Jeddeloh | 711/167 |
| 5,928,343 A | 7/1999 | Farmwald et al. | 710/104 |
| 5,930,273 A | 7/1999 | Mukojima | 714/776 |
| 5,959,914 A | 9/1999 | Gates et al. | |
| 5,973,951 A | 10/1999 | Bechtolsheim et al. | 365/52 |
| 5,974,493 A | 10/1999 | Okumura et al. | 710/307 |
| 5,995,405 A | 11/1999 | Trick | 365/63 |
| 6,003,121 A | 12/1999 | Wirt | |
| 6,011,732 A | 1/2000 | Harrison et al. | |
| 6,038,132 A | 3/2000 | Tokunaga et al. | 361/760 |
| 6,049,476 A | 4/2000 | Laudon et al. | 365/52 |
| 6,076,158 A | 6/2000 | Sites et al. | 712/230 |
| 6,078,515 A | 6/2000 | Nielsen et al. | 365/63 |
| 6,081,868 A | 6/2000 | Brooks | |
| 6,085,276 A | 7/2000 | VanDoren et al. | |
| 6,088,817 A * | 7/2000 | Haulin | 714/42 |
| 6,096,091 A | 8/2000 | Hartmann | 716/17 |
| 6,128,746 A | 10/2000 | Clark et al. | 713/324 |
| 6,145,028 A | 11/2000 | Shank et al. | |
| 6,158,040 A * | 12/2000 | Ho | 714/770 |
| 6,170,047 B1 | 1/2001 | Dye | 711/170 |
| 6,170,059 B1 | 1/2001 | Pruett et al. | 713/200 |
| 6,173,382 B1 | 1/2001 | Dell et al. | 711/170 |
| 6,185,718 B1 | 2/2001 | Dell et al. | |
| 6,198,304 B1 | 3/2001 | Sasaki | |
| 6,215,686 B1 | 4/2001 | Deneroff et al. | 365/52 |
| 6,216,247 B1 * | 4/2001 | Creta et al. | 714/763 |
| 6,219,288 B1 | 4/2001 | Braceras et al. | |
| 6,219,760 B1 | 4/2001 | McMinn | |
| 6,233,639 B1 | 5/2001 | Dell et al. | |
| 6,260,127 B1 | 7/2001 | Olarig et al. | 711/167 |
| 6,262,493 B1 | 7/2001 | Garnett | |
| 6,285,172 B1 | 9/2001 | Torbey | |
| 6,292,903 B1 | 9/2001 | Coteus et al. | 713/401 |
| 6,301,636 B1 | 10/2001 | Schultz et al. | 711/108 |
| 6,308,247 B1 | 10/2001 | Ackerman et al. | |
| 6,317,352 B1 | 11/2001 | Halbert et al. | 365/52 |
| 6,321,343 B1 | 11/2001 | Toda | 713/600 |
| 6,338,113 B1 | 1/2002 | Kubo et al. | 711/105 |
| 6,349,390 B1 | 2/2002 | Dell et al. | |
| 6,357,018 B1 | 3/2002 | Stuewe et al. | |
| 6,370,631 B1 | 4/2002 | Dye | 711/170 |
| 6,378,018 B1 | 4/2002 | Tsern et al. | 710/129 |
| 6,381,685 B2 | 4/2002 | Dell et al. | |
| 6,393,512 B1 | 5/2002 | Chen et al. | |
| 6,393,528 B1 | 5/2002 | Arimilli et al. | 711/137 |
| 6,408,398 B1 | 6/2002 | Frecker et al. | |
| 6,425,044 B1 | 7/2002 | Jeddeloh | |
| 6,446,174 B1 | 9/2002 | Dow | |
| 6,446,224 B1 * | 9/2002 | Chang et al. | 714/54 |
| 6,461,013 B1 | 10/2002 | Simon | |
| 6,467,013 B1 | 10/2002 | Nizar | |
| 6,473,836 B1 | 10/2002 | Ikeda | 711/137 |
| 6,477,614 B1 | 11/2002 | Leddige et al. | |
| 6,477,615 B1 | 11/2002 | Tanaka | |
| 6,483,755 B2 | 11/2002 | Leung et al. | 365/189.05 |
| 6,484,271 B1 | 11/2002 | Gray | |
| 6,487,102 B1 | 11/2002 | Halbert et al. | |
| 6,487,627 B1 | 11/2002 | Willke et al. | 710/306 |
| 6,493,250 B2 | 12/2002 | Halbert et al. | 365/63 |
| 6,496,540 B1 | 12/2002 | Widmer | 375/242 |
| 6,496,910 B1 | 12/2002 | Baentsch et al. | 711/165 |
| 6,499,070 B1 | 12/2002 | Whetsel | |
| 6,502,161 B1 | 12/2002 | Perego et al. | 711/5 |
| 6,505,305 B1 * | 1/2003 | Olarig | 714/5 |
| 6,507,888 B2 | 1/2003 | Wu et al. | 711/105 |
| 6,510,100 B2 | 1/2003 | Grundon et al. | 365/233 |
| 6,513,091 B1 | 1/2003 | Blackmon et al. | 710/316 |
| 6,526,469 B1 | 2/2003 | Drehmel et al. | |
| 6,530,007 B2 | 3/2003 | Olarig | |
| 6,532,525 B1 | 3/2003 | Aleksic et al. | 711/168 |
| 6,546,359 B1 | 4/2003 | Week | 702/186 |
| 6,549,971 B1 | 4/2003 | Cecchi et al. | 710/306 |
| 6,553,450 B1 | 4/2003 | Dodd et al. | 711/105 |
| 6,557,069 B1 | 4/2003 | Drehmel et al. | 710/307 |
| 6,564,329 B1 | 5/2003 | Cheung et al. | 713/322 |
| 6,584,576 B1 | 6/2003 | Co | |
| 6,587,912 B2 | 7/2003 | Leddige et al. | |
| 6,590,827 B2 | 7/2003 | Chang et al. | |
| 6,594,713 B1 | 7/2003 | Fuocco et al. | |
| 6,594,748 B1 | 7/2003 | Lin | |
| 6,601,121 B2 | 7/2003 | Singh et al. | 710/112 |
| 6,601,149 B1 | 7/2003 | Brock et al. | |
| 6,604,180 B2 | 8/2003 | Jeddeloh | |
| 6,611,905 B1 | 8/2003 | Grundon et al. | 711/167 |
| 6,622,217 B2 | 9/2003 | Gharachorloo et al. | 711/141 |
| 6,622,227 B2 | 9/2003 | Zumkehr et al. | |
| 6,625,687 B1 | 9/2003 | Halber et al. | 711/105 |
| 6,625,702 B2 | 9/2003 | Rentscler et al. | |
| 6,628,538 B2 | 9/2003 | Funaba et al. | 365/63 |
| 6,631,439 B2 | 10/2003 | Saulsbury et al. | |
| 6,636,957 B2 | 10/2003 | Stevens et al. | |
| 6,643,745 B1 | 11/2003 | Palanca et al. | |
| 6,671,376 B1 | 12/2003 | Koto et al. | 380/210 |
| 6,678,811 B2 | 1/2004 | Rentschler et al. | 711/167 |
| 6,681,292 B2 | 1/2004 | Creta et al. | |
| 6,684,320 B2 | 1/2004 | Mohamed et al. | |

| Patent | Date | Name | Ref |
|---|---|---|---|
| 6,697,919 B2 | 2/2004 | Gharachorloo et al. | 711/141 |
| 6,704,842 B1 | 3/2004 | Janakiraman et al. | |
| 6,721,185 B2 | 4/2004 | Dong et al. | |
| 6,721,944 B2 | 4/2004 | Chaudhry et al. | |
| 6,738,836 B1 | 5/2004 | Kessler et al. | |
| 6,741,096 B2 | 5/2004 | Moss | |
| 6,748,518 B1 | 6/2004 | Guthrie et al. | |
| 6,754,762 B1 | 6/2004 | Curley | |
| 6,766,389 B2 | 7/2004 | Hayter et al. | |
| 6,775,747 B2 | 8/2004 | Venkatraman | |
| 6,791,555 B1 | 9/2004 | Radke et al. | |
| 6,792,495 B1 | 9/2004 | Garney et al. | |
| 6,799,241 B2 | 9/2004 | Kahn et al. | |
| 6,832,329 B2* | 12/2004 | Ahrens et al. | 714/5 |
| 6,839,393 B1 | 1/2005 | Sidiropoulos | 375/371 |
| 6,845,472 B2* | 1/2005 | Walker et al. | 714/42 |
| 6,847,583 B2 | 1/2005 | Janzen et al. | |
| 6,851,036 B1 | 2/2005 | Toda et al. | |
| 6,874,102 B2 | 3/2005 | Doody et al. | |
| 6,877,076 B1 | 4/2005 | Cho et al. | |
| 6,877,078 B2 | 4/2005 | Fujiwara et al. | |
| 6,882,082 B2 | 4/2005 | Greeff et al. | |
| 6,889,284 B1 | 5/2005 | Nizar et al. | |
| 6,898,726 B1 | 5/2005 | Lee | |
| 6,910,146 B2 | 6/2005 | Dow | |
| 6,918,068 B2 | 7/2005 | Vail et al. | |
| 6,925,534 B2 | 8/2005 | David | |
| 6,938,119 B2 | 8/2005 | Kohn et al. | |
| 6,944,084 B2 | 9/2005 | Wilcox | |
| 6,948,091 B2 | 9/2005 | Bartels et al. | |
| 6,949,950 B2 | 9/2005 | Takahashi et al. | |
| 6,952,761 B2 | 10/2005 | John | |
| 6,965,952 B2 | 11/2005 | Echartea et al. | |
| 6,977,536 B2 | 12/2005 | Chin-Chieh et al. | 327/116 |
| 6,977,979 B1 | 12/2005 | Hartwell et al. | |
| 6,993,612 B2 | 1/2006 | Porterfield | |
| 6,996,639 B2 | 2/2006 | Narad | |
| 6,996,766 B2* | 2/2006 | Cypher | 714/764 |
| 7,039,755 B1 | 5/2006 | Helms | |
| 7,047,370 B1 | 5/2006 | Jeter, Jr. et al. | |
| 7,047,371 B2 | 5/2006 | Dortu | |
| 7,047,384 B2 | 5/2006 | Bodas et al. | |
| 7,051,172 B2 | 5/2006 | Mastronarde et al. | |
| 7,076,700 B2 | 7/2006 | Rieger | |
| 7,091,890 B1 | 8/2006 | Sasaki et al. | |
| 7,103,792 B2 | 9/2006 | Moon | |
| 7,120,743 B2 | 10/2006 | Meyer et al. | |
| 7,133,790 B2 | 11/2006 | Liou | |
| 7,133,972 B2 | 11/2006 | Jeddeloh | |
| 7,155,016 B1 | 12/2006 | Betts et al. | |
| 7,177,211 B2 | 2/2007 | Zimmerman | |
| 7,194,593 B2 | 3/2007 | Schnepper | |
| 7,197,594 B2 | 3/2007 | Raz et al. | |
| 7,197,670 B2* | 3/2007 | Boatright et al. | 714/42 |
| 7,203,318 B2 | 4/2007 | Collum et al. | |
| 7,206,887 B2 | 4/2007 | Jeddeloh | |
| 7,206,962 B2 | 4/2007 | Deegan | |
| 7,210,059 B2 | 4/2007 | Jeddeloh | |
| 7,216,196 B2 | 5/2007 | Jeddeloh | |
| 7,216,276 B1 | 5/2007 | Azimi et al. | |
| 7,222,213 B2 | 5/2007 | James | |
| 7,227,949 B2 | 6/2007 | Heegard et al. | |
| 7,240,145 B2 | 7/2007 | Holman | |
| 7,260,685 B2 | 8/2007 | Lee et al. | |
| 7,266,634 B2 | 9/2007 | Ware et al. | |
| 7,269,765 B1* | 9/2007 | Charlton et al. | 714/710 |
| 7,296,129 B2 | 11/2007 | Gower et al. | |
| 7,313,583 B2 | 12/2007 | Porten et al. | |
| 7,319,340 B2 | 1/2008 | Jeddeloh et al. | |
| 7,321,979 B2 | 1/2008 | Lee | |
| 7,334,159 B1* | 2/2008 | Callaghan | 714/30 |
| 7,353,316 B2 | 4/2008 | Erdmann | |
| 7,363,419 B2 | 4/2008 | Cronin et al. | |
| 7,363,436 B1 | 4/2008 | Yeh et al. | |
| 7,370,134 B2 | 5/2008 | Jeddeloh | |
| 7,376,146 B2 | 5/2008 | Beverly et al. | |
| 7,386,575 B2 | 6/2008 | Bashant et al. | |
| 7,386,771 B2* | 6/2008 | Shuma | 714/718 |
| 7,404,118 B1* | 7/2008 | Baguette et al. | 714/723 |
| 7,418,526 B2 | 8/2008 | Jeddeloh | |
| 7,421,525 B2 | 9/2008 | Polzin et al. | |
| 7,430,145 B2* | 9/2008 | Weiss et al. | 365/200 |
| 7,433,258 B2 | 10/2008 | Rao et al. | |
| 7,487,425 B1* | 2/2009 | Chen | 714/752 |
| 2001/0000822 A1 | 5/2001 | Dell et al. | 711/170 |
| 2001/0003839 A1 | 6/2001 | Kondo | 711/144 |
| 2001/0029566 A1 | 10/2001 | Shin | |
| 2001/0029592 A1* | 10/2001 | Walker et al. | 714/42 |
| 2002/0019926 A1 | 2/2002 | Huppenthal et al. | 712/15 |
| 2002/0038405 A1 | 3/2002 | Leddige et al. | 711/115 |
| 2002/0059439 A1 | 5/2002 | Arroyo et al. | |
| 2002/0083255 A1 | 6/2002 | Greeff et al. | 710/305 |
| 2002/0103988 A1 | 8/2002 | Dornier | 712/38 |
| 2002/0112119 A1 | 8/2002 | Halbert et al. | 711/115 |
| 2002/0112194 A1 | 8/2002 | Uzelac | 713/500 |
| 2002/0124195 A1 | 9/2002 | Nizar | 713/320 |
| 2002/0124201 A1 | 9/2002 | Edwards et al. | |
| 2002/0147898 A1 | 10/2002 | Rentschler et al. | 711/170 |
| 2002/0174274 A1 | 11/2002 | Wu et al. | 710/100 |
| 2003/0009632 A1 | 1/2003 | Arimilli et al. | |
| 2003/0028701 A1 | 2/2003 | Rao et al. | |
| 2003/0033364 A1 | 2/2003 | Garnett et al. | 709/203 |
| 2003/0051055 A1 | 3/2003 | Parrella et al. | |
| 2003/0056183 A1 | 3/2003 | Kobayashi | |
| 2003/0084309 A1 | 5/2003 | Kohn | 713/189 |
| 2003/0090879 A1 | 5/2003 | Doblar et al. | 361/728 |
| 2003/0105938 A1 | 6/2003 | Cooksey et al. | |
| 2003/0118044 A1 | 6/2003 | Blanc et al. | |
| 2003/0126354 A1 | 7/2003 | Kahn et al. | |
| 2003/0126363 A1 | 7/2003 | David | |
| 2003/0223303 A1 | 12/2003 | Lamb et al. | 365/230.06 |
| 2003/0229770 A1 | 12/2003 | Jeddeloh | |
| 2003/0235222 A1 | 12/2003 | Bridges et al. | |
| 2003/0236959 A1 | 12/2003 | Johnson et al. | 711/167 |
| 2004/0006674 A1 | 1/2004 | Hargis et al. | 711/156 |
| 2004/0015650 A1 | 1/2004 | Zumkehr et al. | |
| 2004/0049723 A1 | 3/2004 | Obara | 714/729 |
| 2004/0078615 A1 | 4/2004 | Martin et al. | |
| 2004/0098546 A1 | 5/2004 | Bashant et al. | |
| 2004/0098549 A1 | 5/2004 | Dorst | |
| 2004/0117588 A1 | 6/2004 | Arimilli et al. | 711/203 |
| 2004/0123222 A1 | 6/2004 | Widmer | |
| 2004/0128474 A1 | 7/2004 | Vorbach | 712/10 |
| 2004/0148482 A1 | 7/2004 | Grundy et al. | |
| 2004/0160832 A1 | 8/2004 | Janzen et al. | |
| 2004/0163028 A1 | 8/2004 | Olarig | |
| 2004/0165609 A1 | 8/2004 | Herbst et al. | |
| 2004/0199363 A1 | 10/2004 | Bohizic et al. | |
| 2004/0205433 A1 | 10/2004 | Gower et al. | |
| 2004/0230718 A1 | 11/2004 | Polzin et al. | 710/22 |
| 2004/0246767 A1 | 12/2004 | Vogt | 365/154 |
| 2004/0250153 A1 | 12/2004 | Vogt | 713/500 |
| 2004/0260909 A1 | 12/2004 | Lee et al. | 711/213 |
| 2004/0260957 A1 | 12/2004 | Jeddeloh et al. | |
| 2005/0022065 A1* | 1/2005 | Dixon et al. | 714/42 |
| 2005/0023560 A1 | 2/2005 | Ahn et al. | 257/200 |
| 2005/0027941 A1 | 2/2005 | Wang et al. | |
| 2005/0044305 A1 | 2/2005 | Jakobs et al. | |
| 2005/0050237 A1 | 3/2005 | Jeddeloh et al. | 710/10 |
| 2005/0050255 A1 | 3/2005 | Jeddeloh | 710/317 |
| 2005/0066136 A1 | 3/2005 | Schnepper | 711/154 |
| 2005/0071542 A1 | 3/2005 | Weber et al. | |
| 2005/0071707 A1 | 3/2005 | Hampel | |
| 2005/0078506 A1 | 4/2005 | Rao et al. | |
| 2005/0080581 A1 | 4/2005 | Zimmerman et al. | 702/117 |
| 2005/0081085 A1* | 4/2005 | Ellis et al. | 714/5 |

| | | | |
|---|---|---|---|
| 2005/0081114 A1* | 4/2005 | Ackaret et al. ............... 714/42 |
| 2005/0081129 A1 | 4/2005 | Shah et al. |
| 2005/0086424 A1 | 4/2005 | Oh et al. |
| 2005/0086441 A1 | 4/2005 | Myer et al. |
| 2005/0257005 A1 | 4/2005 | Dell et al. |
| 2005/0097249 A1 | 5/2005 | Oberlin et al. |
| 2005/0105350 A1 | 5/2005 | Zimmerman et al. |
| 2005/0120157 A1 | 6/2005 | Chen et al. ................... 710/313 |
| 2005/0125702 A1 | 6/2005 | Huang et al. |
| 2005/0125703 A1 | 6/2005 | Lefurgy et al. |
| 2005/0138246 A1 | 6/2005 | Chen et al. |
| 2005/0138267 A1 | 6/2005 | Bains et al. |
| 2005/0144399 A1 | 6/2005 | Hosomi ...................... 711/145 |
| 2005/0149665 A1 | 7/2005 | Wolrich et al. |
| 2005/0166006 A1 | 7/2005 | Talbot et al. |
| 2005/0177677 A1 | 8/2005 | Jeddeloh |
| 2005/0177690 A1 | 8/2005 | LaBerge ..................... 711/154 |
| 2005/0188292 A1* | 8/2005 | Chen .......................... 714/768 |
| 2005/0204216 A1 | 9/2005 | Daily et al. .................. 714/724 |
| 2005/0216678 A1 | 9/2005 | Jeddeloh |
| 2005/0220097 A1 | 10/2005 | Swami et al. |
| 2005/0223196 A1 | 10/2005 | Knowles |
| 2005/0229132 A1 | 10/2005 | Butt et al. ..................... 716/10 |
| 2005/0248997 A1 | 11/2005 | Lee |
| 2005/0259496 A1 | 11/2005 | Hsu et al. .................... 365/226 |
| 2005/0289292 A1 | 12/2005 | Morrow et al. |
| 2005/0289377 A1 | 12/2005 | Luong |
| 2006/0004953 A1 | 1/2006 | Vogt |
| 2006/0010339 A1* | 1/2006 | Klein ........................... 714/5 |
| 2006/0036826 A1 | 2/2006 | Dell et al. |
| 2006/0036827 A1 | 2/2006 | Dell et al. |
| 2006/0080584 A1 | 4/2006 | Hartnett et al. |
| 2006/0085602 A1 | 4/2006 | Huggahalli et al. |
| 2006/0095592 A1 | 5/2006 | Borkenhagen |
| 2006/0095679 A1 | 5/2006 | Edirisooriya |
| 2006/0104371 A1 | 5/2006 | Schuermans et al. |
| 2006/0107175 A1 | 5/2006 | Dell et al. |
| 2006/0112238 A1 | 5/2006 | Jamil et al. |
| 2006/0156175 A1* | 7/2006 | McClellan et al. ........... 714/758 |
| 2006/0161733 A1 | 7/2006 | Beckett et al. |
| 2006/0162882 A1 | 7/2006 | Ohara et al. |
| 2006/0168407 A1 | 7/2006 | Stern |
| 2006/0179208 A1 | 8/2006 | Jeddeloh |
| 2006/0190674 A1 | 8/2006 | Poechmueller |
| 2006/0195631 A1 | 8/2006 | Rajamani |
| 2006/0206742 A1 | 9/2006 | James |
| 2006/0212666 A1 | 9/2006 | Jeddeloh |
| 2006/0224764 A1 | 10/2006 | Shinohara et al. |
| 2006/0277365 A1 | 12/2006 | Pong |
| 2006/0288172 A1 | 12/2006 | Lee et al. |
| 2007/0005922 A1 | 1/2007 | Swaminathan et al. |
| 2007/0025304 A1 | 2/2007 | Leelahakriengkrai et al. |
| 2007/0038907 A1 | 2/2007 | Jeddeloh et al. |
| 2007/0061675 A1* | 3/2007 | Holman ...................... 714/758 |
| 2007/0067382 A1 | 3/2007 | Sun |
| 2007/0083701 A1 | 4/2007 | Kapil |
| 2007/0160053 A1 | 7/2007 | Coteus et al. |
| 2008/0043808 A1 | 2/2008 | Hsu et al. |
| 2008/0162807 A1 | 7/2008 | Rothman et al. |
| 2008/0163014 A1* | 7/2008 | Crawford et al. ............ 714/723 |
| 2008/0222379 A1 | 9/2008 | Jeddeloh |
| 2009/0006900 A1* | 1/2009 | Lastras-Montano et al. ... 714/42 |
| 2009/0300413 A1* | 12/2009 | Chang et al. .................. 714/8 |

FOREIGN PATENT DOCUMENTS

| | | |
|---|---|---|
| EP | 0470734 A1 | 2/1992 |
| EP | 0899743 A2 | 6/1998 |
| EP | 1429340 A2 | 6/2004 |
| GB | 2396711 A | 6/2004 |
| JP | 59153353 A | 9/1984 |
| JP | 0114140 A | 6/1989 |
| JP | 0432614 | 11/1992 |
| JP | 10011971 | 1/1998 |
| JP | 2004139552 A | 5/2004 |
| JP | 2008003711 A | 1/2008 |
| WO | 9621188 | 7/1996 |
| WO | 9812651 | 3/1998 |
| WO | 0004881 A2 | 1/2000 |
| WO | 0223353 A2 | 3/2002 |
| WO | WO2005038660 | 4/2005 |
| WO | 2007109888 | 10/2007 |

OTHER PUBLICATIONS

Yang, Q.; Bhuyan, L.N., "Analysis of packet-switched multiple-bus multiprocessor systems," Computers, IEEE Transactions on, vol. 40, No. 3, pp. 352-357, Mar. 1991.

Li, P; Martinez, J.; Tang, J.; Priore, S.,; Hubbard, K.; Jie Xue; Poh, E.; Ong MeiLin; Chok KengYin; Hallmark, C.; Mendez, D.; "Development and evaluation of a high performance fine pitch SODIMM socket package." Electronic Components and Technology Conference, 2004. Proceedings. 54th, vol. 1, pp. 1161-1166, Jun. 1-4, 2004.

PCT International Search Report PCT/EP2006/068984. Mailed Feb. 16, 2007.

PCT International Search Report PCT/EP2007/057916. Mailed Dec. 14, 2007.

Luca Benini, et al., "System-Level Powers Optimization: Techniques and Tools", ACM Transactions on Design Automation of Electronic Systems, vol. 5, No. 2, Apr. 2000, pp. 115-192.

Boudon, et al., "Novel Bus Reconfiguration Scheme With Spare Lines", IBM Technical Disclosure Bulletin, May 1987, vol. 29, No. 12, pp. 1-3.

Brown, et al "Compiler-Based I/O Prefetching for Out-of-Core Applications", ACM Transactions on Computer Systems, vol. 19, No. 2, May 2001, pp. 111-170.

Ghoneima et al.; "Optimum Positioning of Interleaved Repeaters in Bidirectional Buses;" IEEE Transactions on Computer-Aided Design of Integrated Circuits and Systems, vol. 25, No. 3, Mar. 2005, pp. 461-469.

JEDEC Solid State Technology Association, "JEDEC Standard: DDR2 SDRAM Specification", Jan. 2004, JEDEC, Revision JESD79-2A, p. 10.

Jungjoon Kim et al.; "Performance and Architecture Features of Segmented Multiple Bus System;" IEEE Computer Society; 1999 International Conference on Parallel Processing (ICPP '99).

Massoud Pedram, "Power Minimization in IC Design Principles and Applications", ACM Transactions on Design Automation of Electronic Systems vol. 1, No. 1, Jan. 1996, pp. 3-56.

Natarajan, et al., "A Study of Performance Impact of Memory Controller Features in Multi-Processor Server Environment", pp. 80-87.

NB940259 (IBM Technical Disclosure Bulletin, Feb. 1994; vol. 37; pp. 59-64).

Nilsen, "High-Level Dynamic Memory Management for Object-Oriented Real-Time Systems", pp. 86-93.

P.R. Panda, "Data and Memory Optimization Techniques for Embedded Systems", ACM Transactions on Design Automation of Electronic Systems, vol. 6, No. 2, Apr. 2001, pp. 149-206.

Penrod, Lee, "Understanding System Memory and CPU Speeds: A laymans guide to the Front Side Bus (FSB)", Dec. 28, 2005, Direction . Org, pp. 1-5, http://www.directron.com/directron/fsbguide.html. [online]; [retrieved on Feb. 23, 2006]; retrieved from the Internet.

Seceleanu et al.; "Segment Arbiter as Action System;" IEEE 2003 pp. 249-252.

Singh, S., et al., "Bus Sparing for Fault-Tolerant System Design", IBM Technical Disclosure Bulletin, Dec. 1991, vol. 34, No. 71, pp. 117-118.

Sivencrona et al.; "RedCAN™: Simulations of two Fault Recovery Algorithms for CAN;" Proceedings for the 10th IEEE Pacific Rim International Symposium on Dependable Computing (PRDC'04); 2005.

U.S. Appl. No. 11/419,586, filed May 22, 2006. Robert Tremaine. "Systems and Methods for Providing Remote Pre-Fetch Buffers".

Wang, et al., "Guided Region Prefetching: A Cooperative Hardware/Software Approach", pp. 388-398.

Wikipedia, Serial Communications, [online], [retrieved Apr. 10, 2007 from the Internet], http://en.wikipedia.org/wiki/Serial_communications, 3 pages.

International Search Report, International Application No. PCT/EP2007/054929, International Publication No. WO 2007/135144 A1.

IEEE, "IEEE Standard Test Access Port and Boundary-Scan Architecture", Jul. 23, 2001, IEEE Std 1149-1-2001, pp. 11-13.

Rosenberg, "Dictionary of Computers, Information Processing & Telecommuications", Second Edition, John Wiley & Sons, Inc. 1987. 3 pgs.

Joe Jeddeloh, Fully Buffered DIMM (FB-DIMM), XP002490174, Advanced Systems Technology, Micron Technology, Inc. Apr. 16, 2008, 32 pages.

Timothy J. Dell, "The RAS Implications of DIMM Connector Failure Rates in Large, Highly Available Server Systems", The 53rd IEEE Holm Conference on Electrical Contacts, IEEE, Sep. 16-19, 2007, pp. 256-261.

"Using Dual and Mappable Spare Bus", XP000433763, IBM Technical Disclosure Bulletin, vol. 37, No. 2B, IBM Copr., NY, US, Feb. 1, 1994, pp. 59-63.

"Novel Bus Reconfiguration Scheme With Spare Lines", XP000676205, IBM Technical Disclosure Bulletin, vol. 29, No. 12, IBM Copr., NY, US, May 12, 1987, pp. 5590-5593.

European Search Report, European Patent Application 05106700.7.

International Search Report, International Patent Application No. PCT/US07/75944, mailed Sep. 23, 2008, 3 pages.

European Search Report, European Patent Application No. 05106701.5, mailed Oct. 7, 2008, 5 pages.

European Search Report, European Patent Application No. 05109837.4, mailed Oct. 7, 2008, 5 pages.

IBM. IBM WebSphere Enterprise Service Bus. Version 6.0.2 2006.

BEA Systems Inc. Integration of Clustered BEA AquaLogic Service Bus Domain and Remote Tibco Enterprise Message Service 4.2.0 for Messaging Application in SOA. BEA White Paper. 2006.

Oracle. Oracle Enterprise Service Bus. Oracle Data Sheet. Oct. 2006.

* cited by examiner

Generation of $A_{1+2}$, $A_{2+3}$, $A_{1+3}$, from the syndromes.

SYSTEMS AND METHODS FOR IMPROVING SERVICEABILITY OF A MEMORY SYSTEM

BACKGROUND OF THE INVENTION

This invention relates generally to computer systems, and more particularly to improving the serviceability of a memory system in the presence of defective memory parts.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), the type and structure of the memory interconnect interface(s) and the type and efficiency of any failure detection/correction function associated with one or more elements of the system.

FIG. 1 relates to U.S. Pat. No. 5,513,135 to Dell et al., of common assignment herewith, and depicts an early synchronous memory module. The memory module depicted in FIG. 1 is a dual in-line memory module (DIMM). This module is composed of synchronous DRAMs 108, buffer devices 112, an optimized pinout, and an interconnect and capacitive decoupling method to facilitate high performance operation. The patent also describes the use of clock re-drive on the module, using such devices as phase-locked loops (PLLs).

FIG. 2 relates to U.S. Pat. No. 6,173,382 to Dell et al., of common assignment herewith, and depicts a computer system 210 which includes a synchronous memory module 220 that is directly (i.e. point-to-point) connected to a memory controller 214 via a bus 240, and which further includes logic circuitry 224 (such as an application specific integrated circuit, or "ASIC") that buffers, registers or otherwise acts on the address, data and control information that is received from the memory controller 214. The memory module 220 can be programmed to operate in a plurality of selectable or programmable modes by way of an independent bus, such as an inter-integrated circuit (I2C) control bus 234, either as part of the memory initialization process or during normal operation. When utilized in applications requiring more than a single memory module connected directly to a memory controller, the patent notes that the resulting stubs can be minimized through the use of field-effect transistor (FET) switches to electrically disconnect modules from the bus.

Relative to U.S. Pat. No. 5,513,135, U.S. Pat. No. 6,173,382 further demonstrates the capability of integrating all of the defined functions (address, command, data, presence detect, etc) into a single device. The integration of functions is a common industry practice that is enabled by technology improvements and, in this case, enables additional module density and/or functionality.

Extensive research and development efforts are invested by the industry, on an ongoing basis, to create improved and/or innovative solutions to maximizing overall system performance and density by improving the memory system/subsystem design and/or structure. The need for high-availability and minimal (if any) downtime presents further challenges as related to overall system reliability due to customer expectations that new computer systems will markedly surpass existing systems in regard to mean-time-between-failure (MTBF), in addition to offering additional functions, increased performance, increased storage, lower operating costs, etc.

The use of enhanced error correction techniques has been a major factor in improving MTBF, however it is becoming increasingly difficult to identify a single failing module within a cluster (2, 4 or more) of modules that are accessed in parallel to service a cache line access (typically 64 bytes, 128 bytes or larger). This is particularly true in cases where the error is identified by the ECC structure as being "uncorrectable." During scheduled or unscheduled repair actions, given the limited amount of failure data (especially in cases where an uncorrectable error has resulted in the repair action) and the need to bring the system online quickly, it is common for more than one memory module to be removed in response to an apparent memory system failure. It would be desirable to have the capability of quickly and accurately identifying specific failing memory modules in order to reduce the number of functional modules that are unnecessarily replaced.

BRIEF SUMMARY OF THE INVENTION

An exemplary embodiment includes a method for identifying a failing memory element in a memory system when two or more modules operate in unison in response to a read request. The method includes receiving syndrome bits and an address associated with an uncorrectable error (UE). In response to a previous correctable error (CE) having occurred, the location of the previous CE is retrieved. The location of the CE specifies a memory device position of the CE. A location of the UE is determined using the location of the previous CE and the syndrome bits of the UE as input. The location of the UE specified a memory device position. A failing memory element associated with the location of the UE is identified.

An exemplary embodiment also includes a method for identifying a failing memory element in a memory system where two or more memory modules operate in unison in response to a read request. The method includes receiving an address associated with an UE and data related to the UE including one or more of syndrome bits and read data related to the UE. In response to a previous CE having occurred, data related to the previous CE is retrieved. The failing memory element is identified using the data related to the previous CE and the data related to the UE as input.

A further exemplary embodiment includes a memory system for identifying a failing memory element. The memory system includes two or more memory modules, storage means and a processor. Each of the memory modules includes memory devices and at least two of the two or more memory modules operate in unison in response to read requests. The storage means stores failure information associated with a first fail at an address. The processor includes logic for facilitating receiving syndrome bits and an address associated with an UE. In response to a previous CE having occurred, the location of the previous CE is retrieved. The location of the CE specifies a memory device position of the CE. A location of the UE is determined using the location of the previous CE and the syndrome bits of the UE as input. The location of the UE specified a memory device position. A failing memory element associated with the location of the UE is identified.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Exemplary embodiments assist in the identification of specific failing memory modules in a memory system in order to reduce the number of memory modules being replaced when a failure occurs in the memory system. The location information of a first, correctable, byte error is utilized to find the location of a second, uncorrectable, byte error. In exemplary embodiments, the location of the second error is employed to identify a defective memory element (e.g., module or memory device). In addition, the second byte error may be corrected, thereby allowing the memory system to continue execution for production and/or diagnostic purposes.

Current state-of-the-art in some computer systems is to encode the data using a one byte error correct, two byte error detect Reed-Solomon (or equivalent) error control code. This code allows the system to recover from single bit upsets as well as failures affecting up to an entire DRAM memory chip when the code is applied appropriately (e.g., so that any memory chip failure affects at most one byte). This first error that is corrected is referred to as a correctable error (CE). The class of memory chip failures includes massive failures (e.g., a "chipkill") or more commonly, failures of individual I/O lanes caused by events such as I/O driver/receiver failures, and connector failures.

When a second error takes place when using the above Reed-Solomon code, the code (as it is currently being employed) cannot correct the error and generates an uncorrectable error (UE) signal. A common policy is to halt execution of the system when an UE occurs. Nevertheless, it is frequently the case that the two errors (i.e., the CE and the UE) do not initially occur simultaneously—rather, a first failure type occurs at an address (e.g. a single bit failure, an I/O failure, a chip kill, etc) and only after some additional time, a second failure occurs which affects a different bit, byte or portion of a byte within the same ECC word. In the intervening time, additional accesses to the data associated with the address (e.g. accesses requested by the processor, accesses due to a scrubbing mechanism, etc) will result in persistent errors coinciding with the first failure type and location.

Figure 3:
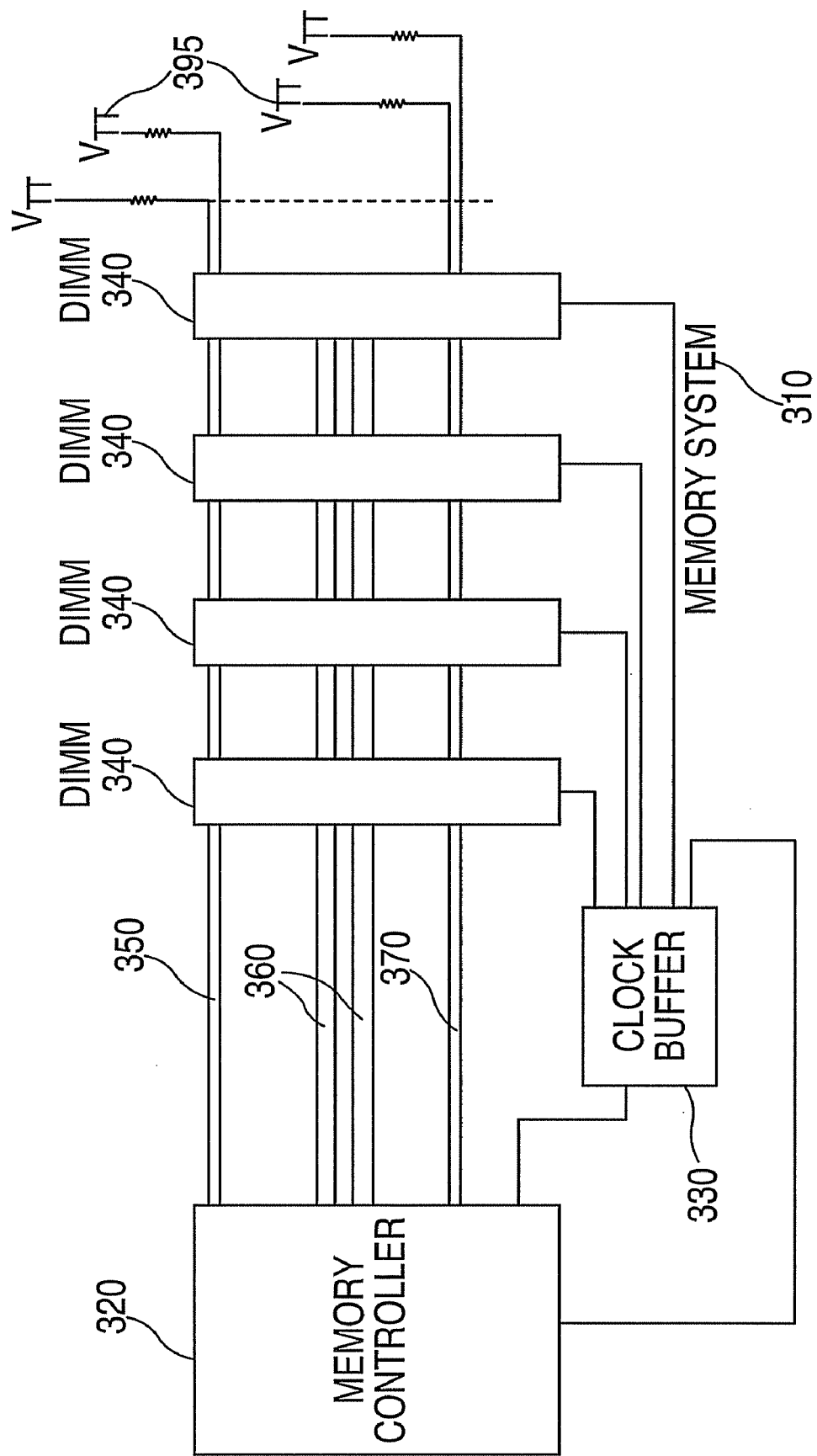
FIG. 3 depicts an exemplary memory system, shown with a single, traditional multi-drop stub bus.
Figure 4:
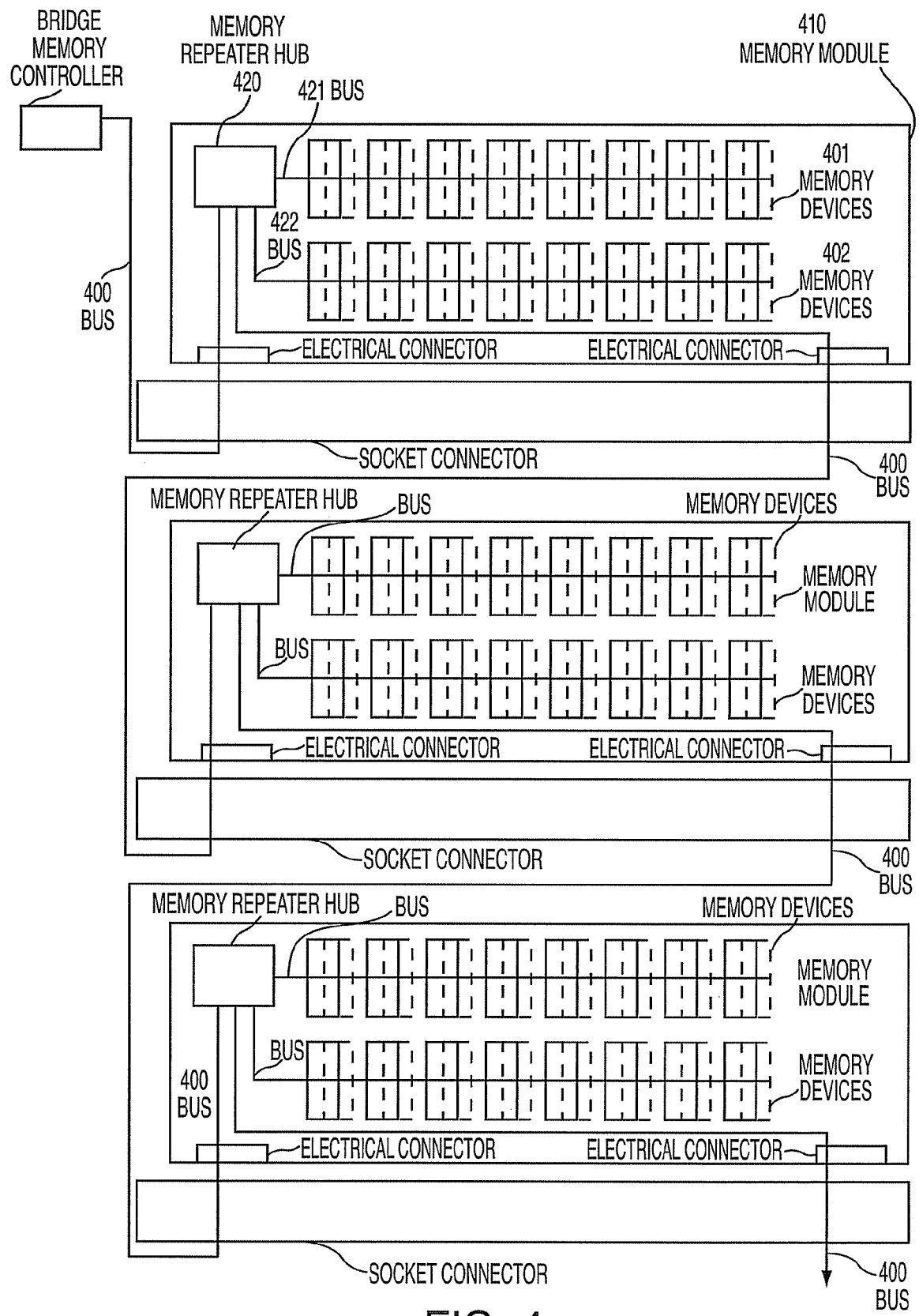
FIG. 4 depicts a fully buffered synchronous memory module and system structure, where the fully buffered synchronous memory module includes a repeater function.
Figure 5:
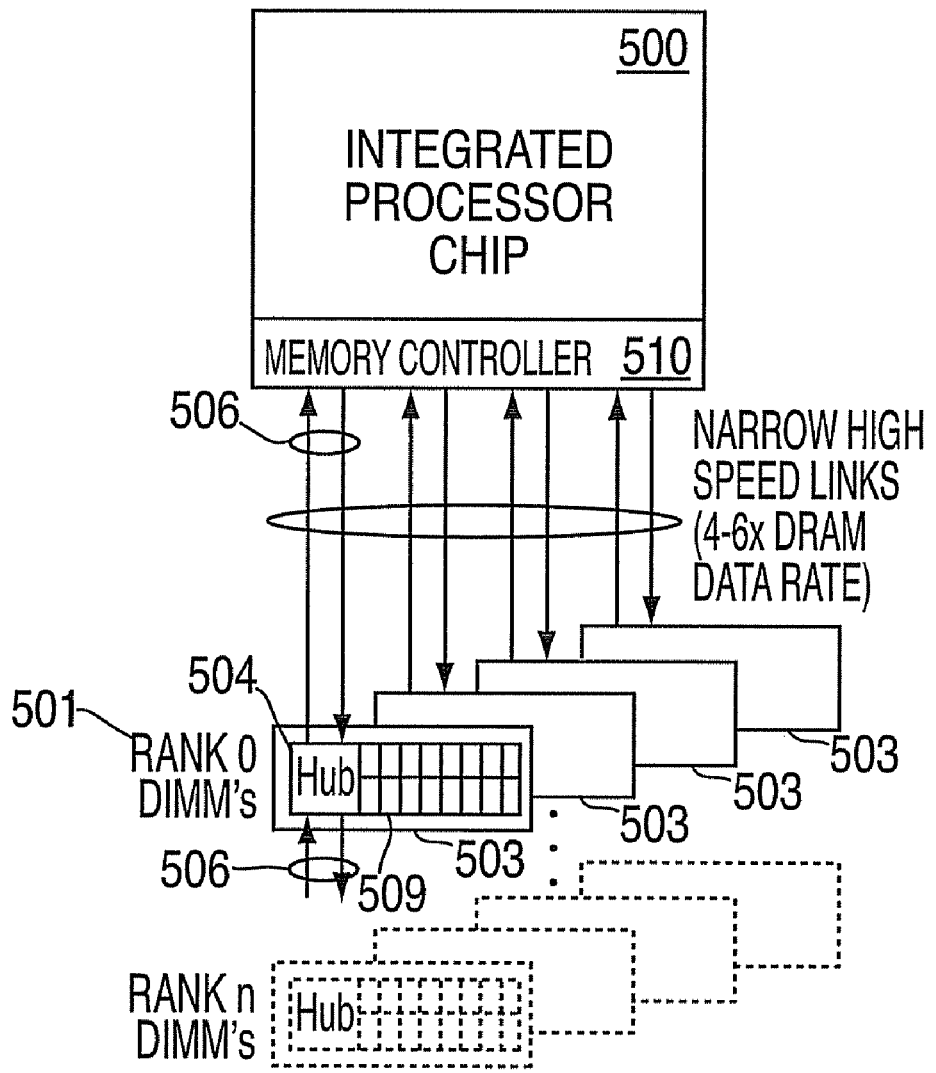
FIG. 5 depicts a block diagram of a computer memory system which includes multiple independent cascade interconnect memory interface busses that operate in unison to support a single data access request.

FIGS. 3-5 that follow are used as a means of describing example conventional memory structures to which exemplary embodiments of the present invention would apply.

FIG. 3, from U.S. Pat. No. 6,510,100 to Grundon et al., of common assignment herewith, depicts a simplified diagram and description of a memory system 310 that includes up to four registered DIMMs 340 on a traditional multi-drop stub bus. The subsystem includes a memory controller 320, an external clock buffer 330, registered DIMMs 340, an address bus 350, a control bus 360 and a data bus 370 with terminators 395 on the address bus 350 and the data bus 370. Although only a single memory channel is shown in FIG. 3, systems produced with these modules often included more than one discrete memory channel from the memory controller, with each of the memory channels operated singly (when a single channel was populated with modules) or in parallel (when two or more channels where populated with modules) to achieve the desired system functionality and/or performance. Using conventional registered DIMMs, a data bus width of 72 bits would be available from each memory channel. Although only one channel is shown, a system would often have 2, 4 or more memory channels of the type shown, resulting in a transfer of 32, 64, 128 or more bytes of data in response to a cache line operation. Further, each DIMM 340, or memory module, would generally include 72 bits of data, permitting the use of ECC to correct most data errors, with the ECC circuitry, or logic, located in the memory controller 320.

FIG. 4, from U.S. Pat. No. 6,587,912 to Bonella et al., depicts a synchronous memory module 410 and system structure in which the repeater hubs 420 include local re-drive of the address, command and data to the local memory devices 401 and 402 via buses 421 and 422; generation of a local clock (as described in other figures and the patent text); and the re-driving of the appropriate memory interface signals to the next module or component in the system via bus 400.

FIG. 5 depicts a memory system composed of an integrated processor chip 500, which contains one or more processor elements and an integrated memory controller 510. In the configuration depicted in FIG. 5, multiple independent cascade interconnected memory interface busses 506 are logically aggregated together to operate in unison to support a single independent access request at a higher bandwidth with data and error detection/correction information distributed or "striped" across the parallel busses and associated devices. The memory controller 510 attaches to four narrow/high speed point-to-point memory busses 506, with each bus 506 connecting one of the several unique memory controller interface channels to a cascade interconnect memory subsystem 503 which includes at least a hub device 504 and one or more memory devices 509 (or DRAMs). Using contemporary synchronous memory devices, an access initiated by the memory controller 510 would commonly result in a transfer of 128 bytes of data (8 byte DIMM width×4 DIMMs operating in unison×4 bit burst from each selected DRAM).

Using conventional buffered DIMMs, a data bus width of 72 bits would be available on each DIMM (typically by accessing 9 memory devices 509 that are 8 bits wide, or by accessing 18 memory devices 509 that are 4 bits wide), permitting the use of ECC to identify and correct most data errors. As with FIGS. 3 and 4, the data path ECC circuitry, or logic in FIG. 5, would generally be located in the memory controller 510 and include the check bit generation and subsequent error detection and correction.

Although contemporary memory ECC structures may be implemented as described relative to FIGS. 3-5, the location of the ECC function (e.g., the ECC circuitry or logic) may reside outside of the memory controller in other system elements, including the processor(s) themselves, the memory hub, register, buffer or other memory interface device residing between the memory controller and the memory devices, or in the memory devices themselves.

Figure 6:
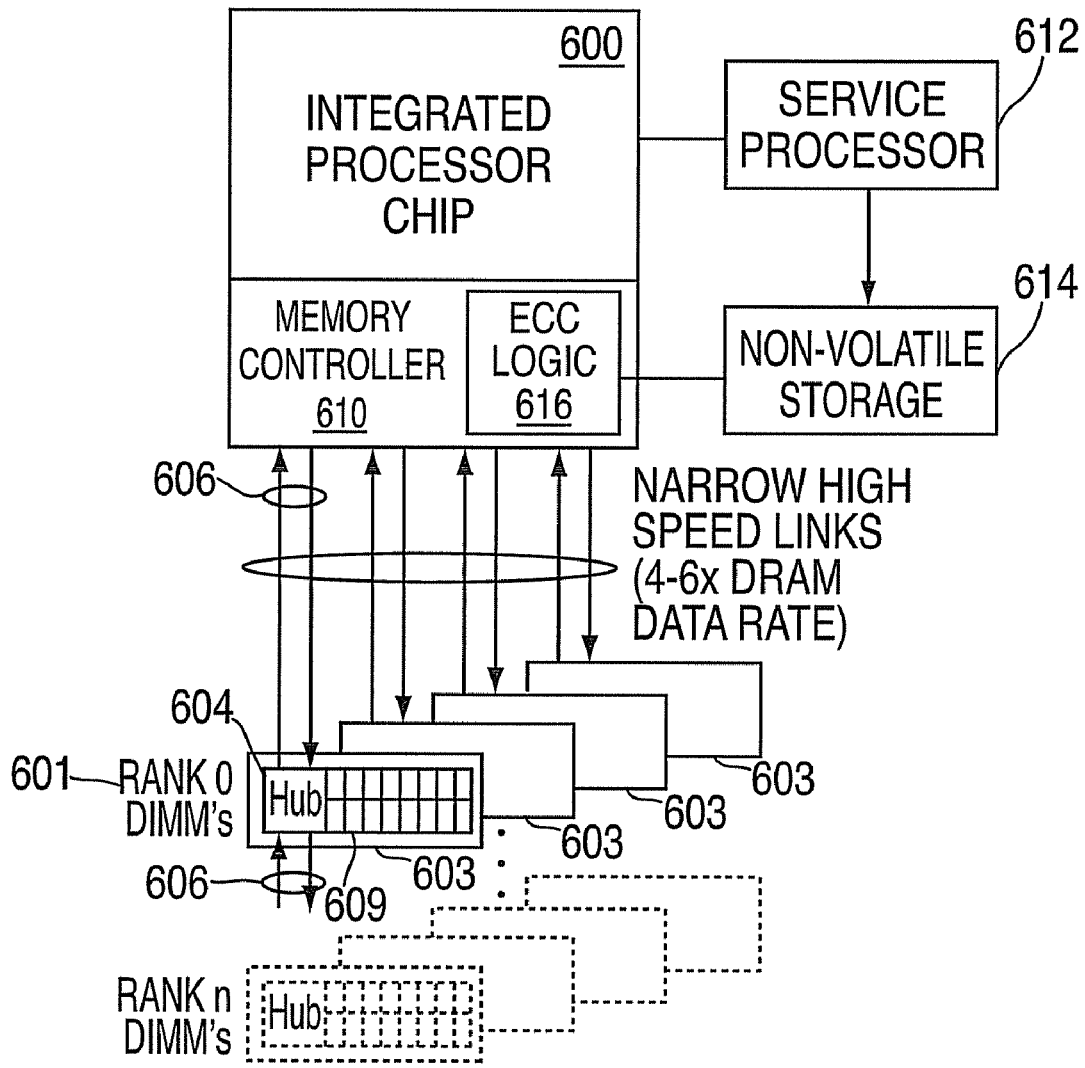
FIG. 6 depicts a block diagram of a computer memory system that may be utilized to implement exemplary embodiments of the present invention.

FIG. 6 depicts a block diagram of a computer memory system that may be utilized to implement exemplary embodiments of the present invention. FIG. 6 depicts a memory system composed of an integrated processor chip 600, which contains one or more processor elements and an integrated memory controller 610. In the configuration depicted in FIG. 6, multiple independent cascade interconnected memory interface busses 606 are logically aggregated together to operate in unison to support a single independent access request at a higher bandwidth with data and error detection/correction information distributed or "striped" across the parallel busses and associated devices. The memory controller 610 attaches to four narrow/high speed point-to-point memory busses 606, with each bus 606 connecting one of the several unique memory controller interface channels to a cascade interconnect memory subsystem 603 which includes at least a hub device 604 and one or more memory devices 609 (or DRAMs).

The memory system in FIG. 6 is similar to the memory system depicted in FIG. 5 with the addition of a service processor 612, non-volatile storage (NVS) 614 for storing information about the errors (e.g., their address, their location, the data retrieved, and syndrome bits), and an ECC logic block 616. In the exemplary embodiment depicted in FIG. 6, portions of the UE processing described herein (e.g., see FIG. 8) are located within the ECC logic 616 in the memory controller and other portions of the UE processing are located in the service processor 612. An advantage to utilizing the service processor 612 external to the integrated processor chip 600 is that it may be utilized to perform error diagnostics even when the integrated processor chip 600 is not operational. Similarly, an advantage to utilizing the service processor 612 external to the memory controller 610 is that it may be utilized to perform error diagnostics even when the memory controller 610 is not operational. In addition, an advantage to using NVS 614 for storing information about the errors is that it is accessible when the memory controller 610 and/or the service processor is not operational.

Figure 7:
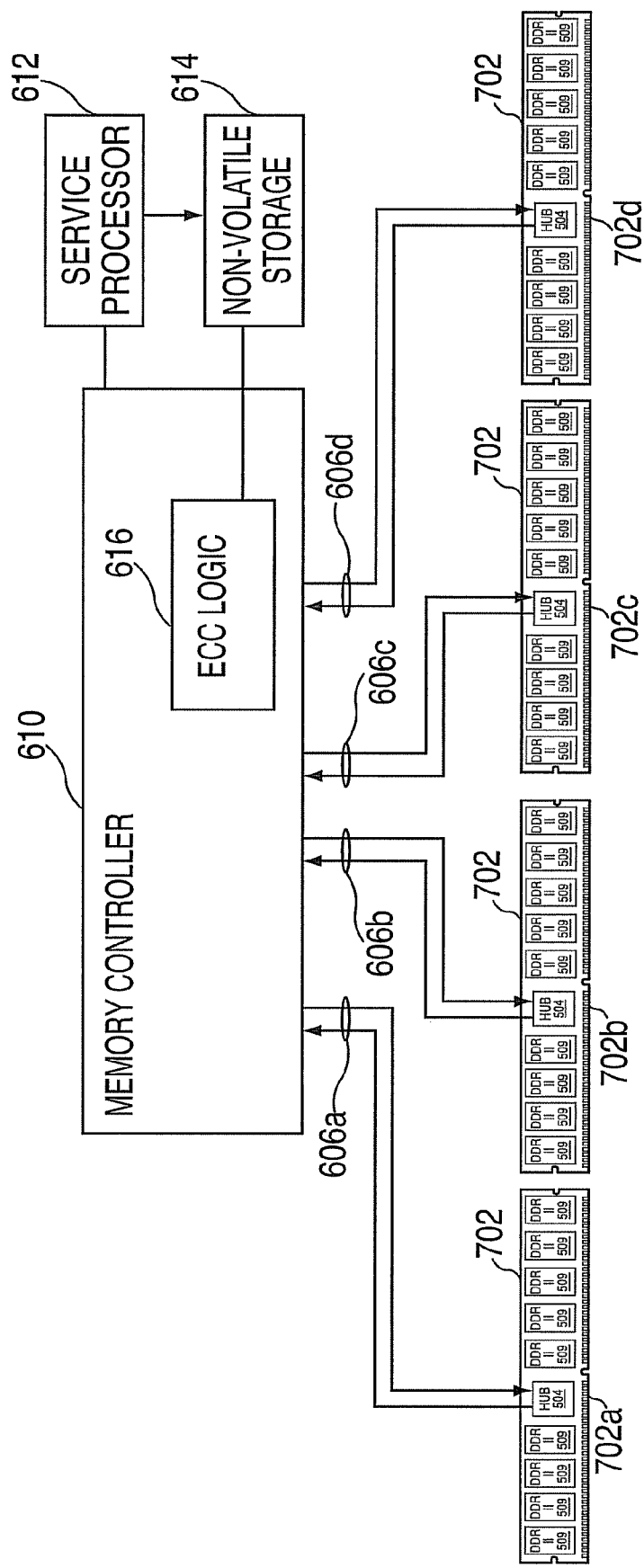
FIG. 7 depicts a memory structure with cascaded memory modules and unidirectional busses that may be utilized to implement exemplary embodiments of the present invention.

FIG. 7 depicts a memory structure with cascaded memory modules and unidirectional busses that may be utilized to implement exemplary embodiments of the present invention. FIG. 7 is another view of FIG. 6, with the service processor 612 and NVS 614 located external to the memory controller 610. In the example described herein, and typical for current memory systems, the cache line is 128 bytes; however this number could be varied without departing from the scope of exemplary embodiments of the present invention described herein. The memory system depicted in FIG. 7 includes only one memory module 702, with the option of having one or more additional modules cascade interconnected to one or more of the modules 702 (as shown, for example in FIG. 6).

Other embodiments may include only one rank of memory modules or other combinations of modules as required to optimally provide the required system line size (e.g. 32, 64, 128, 256 bytes, etc).

As depicted in FIG. 7, the memory controller 610 attaches to four narrow/high speed point-to-point memory busses 606a, 606b, 606c, 606d with each bus connecting one of the several unique memory controller interface channels to a memory module 702a, 702b, 702c and 702d, respectively. In the exemplary embodiment depicted in FIG. 7, each of the memory modules 702 contains memory devices 509, each with 8 data input/output (I/O) lanes and operating with a burst length of four. The burst length is the number of data beats (e.g. sequential data transfers) that each of the selected memory devices 509 will process (e.g. read or write) through the I/O lanes (via the memory busses 606) in any given access to the memory device(s) 509. In the exemplary embodiment, a total of 32 memory devices 509 are needed to service a 128 byte cache line. Generally, as depicted in FIG. 7, an additional, ninth, memory device 509 is provided for every eight memory devices 509 in the memory module 702. In the example depicted in FIG. 7 this provides a total of four additional memory devices 509 across the four memory modules 702. In the exemplary embodiment, one of the four additional memory devices 509 is designated as a spare memory device 509, with the other three being utilized to store ECC information.

A Reed-Solomon code that protects 32 bytes of data with 3 additional redundant bytes is applied on each memory device data beat. This code is capable of correcting any one byte error and detecting any two byte errors. When two byte errors occur, this Reed Solomon code may be utilized to correct both errors if the location of both of the errors is known. In the memory system depicted in FIG. 7, an up to one byte error will be identified and corrected on any of the memory devices 509 on one of the four memory modules 702. Exemplary embodiments of the present invention are directed to determining the location of a second error, affecting up to a full byte of data (e.g. a chip kill). Once the location of the second error is determined, the second error may be corrected and/or the location may be determined and reported to aid in identifying which memory element(s) (e.g., memory device 509, memory subsystem 603, memory module 702, etc) have failed, and which of the replaceable elements (e.g. memory module(s), memory card(s), etc) should be replaced to correct the error(s) in the memory system.

In exemplary embodiments of the present invention, the memory devices 509 are numbered sequentially from 1 to 36 starting at the leftmost memory device 509 in FIG. 7 to designate a location of the memory device 509 (and therefore to designate an error location). The nine memory devices 509 in memory module 702a are numbered from 1 to 9; the memory devices 509 in memory module 702b from 10 to 18; the memory devices 509 in memory module 702c from 19 to 27; and the memory devices 509 in memory module 702d from 28 to 36. Thus, if an error is in location 20, the error is associated with the second memory device 509 from the left in memory module 702c. Using the device position, or location, a corresponding failing memory element, such as memory modules 702c, can be identified for replacement. The failure location information can further be used to facilitate subsequent repair of the failing module, by including the device failing location(s), along with the failing module, when returning the module for repair. In further exemplary embodiments, more or less than 9 memory devices may be installed on memory modules 702 (typically 18, 36 or 72), with the failing bit, bits or byte location used to identify the failing module (e.g. module 702c having 18, 8 bit wide memory devices and the error(s) related to the 4$^{th}$ group of 8 bits across the 72 bit module data width). In multi-rank (memory modules, such as the 72 bit module described having 18, 8 bit wide memory devices, the address of the failure would identify the failing memory device rank.

The memory module configuration (e.g., memory device count, memory device data width, module density, etc) is determined during system initialization, at which point the processor, service processor, memory controller or other control element interrogates a non-volatile memory (e.g. the Serial Presence Detect, or SPD EEPROM) installed on the memory modules, generally by means of an IIC or similar interface bus. Once the memory subsystem structure is determined, the memory interface is initialized to permit high speed communication (e.g., via busses 606) and further initialization and verification operations are completed prior to normal system operation. During these subsequent steps, the ECC logic 616 and non-volatile storage 614 can be configured to permit the correct identification of failing memory devices and/or modules, based on the memory device and module information determined during the module interrogation process.

In exemplary embodiments of the present invention, when a UE or CE is detected by the standard ECC processing (e.g., the standard ECC decoder for detecting the existence of double errors and correcting single errors that is already being performed by contemporary memory systems), information about the errors is stored in a storage medium (e.g., the NVS 614) accessible by another system, such as the service processor 612. In the exemplary embodiment, this second system analyzes the information through a software and/or hardware tool that implements an algorithm to locate the second, UE, error. Other exemplary embodiments may complete this analysis in the processor, the memory controller, an external processing device or some other processing or analysis means. In order to determine the location of the failures contributing to the UE error, the uncorrectable error has to occur at an address for which a correctable error was previously logged during a memory access. The minimum necessary information needed by the second system is the syndromes of the data read for the UE and the location of the (persistent) first error, or CE. The syndromes of the UE are obtained by multiplying the ECC parity check matrix (usually denoted by H) by the received data vector (usually denoted by c, with c being a column vector). This can be expressed as s=Hc. The syndromes of the UE together with the location of the first error are all that is needed by the software tool in the second system to obtain the location of the second error, and if desired, the magnitudes of both the first and second errors. Alternatively, the actual data read when the UE and CE occur may be stored instead of or in addition to the syndromes. This may allow the software tool on the second system to determine the nature of the failure (e.g., that an I/O lane always outputs a "1" bit regardless of the input value). This information can also be used, for example, to gather failure statistics.

Figure 8:
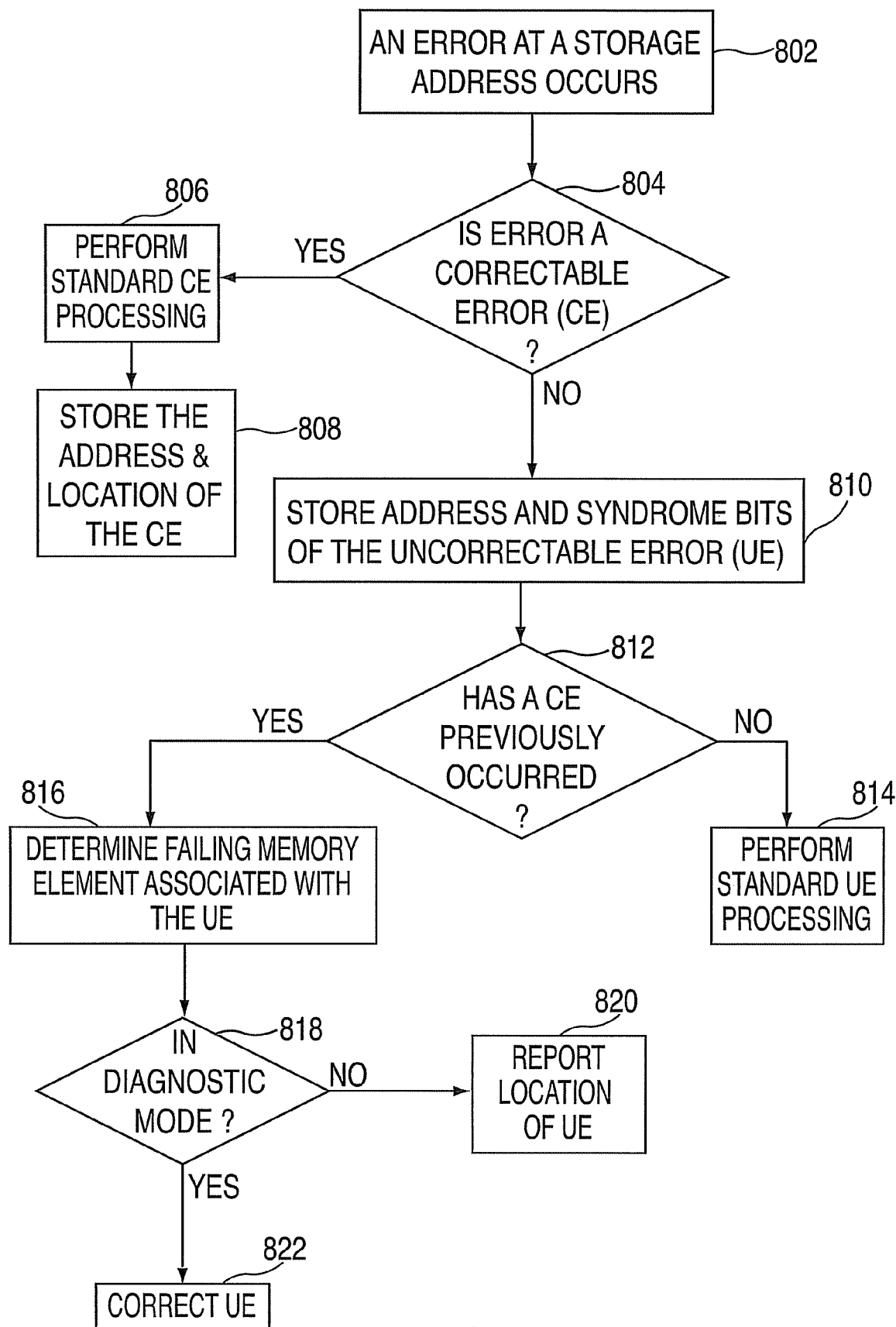
FIG. 8 is a process flow that may be implemented by exemplary embodiments of the present invention to identify the location of uncorrectable errors.

FIG. 8 is a process flow that may be implemented by exemplary embodiments of the present invention to identify the location of an UE (e.g., a second byte error). FIG. 8 depicts an exemplary process for identifying a failing memory element (e.g., a memory device and/or memory module) in a memory system (see, for e.g., FIGS. 5-7 and 9) when two or more memory modules operate in unison in response to a read request. At block 802, an error is detected when an access is made to a particular storage location. In exemplary embodiments, the error is detected by the standard ECC processing. If the error is a CE, as determined at block 804, then block 806 is performed and the standard ECC CE processing is performed to determine the location of the CE and to correct the CE. In exemplary embodiments block 806 is performed by the standard ECC processing located in contemporary memory controllers. Next, block 808 is performed to store the address and location of the CE. In exemplary embodiments, this information is stored in NVS 614 so that it may be accessed even when the memory controller 610 is not operational. In further exemplary embodiments, only a single copy of each unique failure will be stored, and an error count will be compiled for each unique fail (up to a pre-determined maximum count), which can be used to verify that the CE is a persistent error.

If it is determined at block 804 that the error is a UE, then block 810 is performed. At block 810, the address and syndrome bits of the UE are stored, for example, in the NVS 614. At block 812, a check is made to determine if a CE has previously occurred. IF a CE has not previously occurred, then block 814 is executed to perform standard UE processing. In exemplary embodiments this is performed by the standard ECC processing in contemporary memory controllers and may result in the memory system operation being halted. The processing depicted in FIG. 8 may be utilized in a chip-kill situation, in that when a double error occurs there is a good chance that the one of the errors came from the chip-kill.

If a CE has previously occurred, then block 816 is performed to determine the failing memory element associated with the UE. In exemplary embodiments, this is performed using the syndrome bits of the UE and the location of the previous CE. In exemplary embodiments, this is performed by assuming that the location (e.g., the bit location or the byte location) for one of the errors contributing to the UE is the same as the location of the error(s) for the CE. In exemplary embodiments the location specifies a position of a memory device on a memory module. In alternate exemplary embodiments, more elaborate schemes are utilized to determine the location of the UE, such as the one described below herein. Based on the location of the UE, the failing memory element is identified. Block 820 is performed if the memory controller 610 is not in diagnostic mode, as determined at block 818. At block 820, the location of the UE is reported (e.g. the one or more modules contributing one or more bit failures at the time the UE was identified). In alternate exemplary embodiments, the failing module location will consist of the module having the first, persistent CE error—with the module having the second error (if on a separate module) not identified until a CE error threshold is met, or until the second error is identified as a first, persistent error during a future access which includes an uncorrectable error. The reporting can include initiating a visual indicator (e.g., a flashing light or LED, a pattern of flashing lights) on the memory module, on the memory socket (into which the memory module is installed), next to the failing module, etc, and/or reporting the error via an alert, printed output, electronic notification or other verbal, visual or related means. Otherwise, if the memory controller 610 is in diagnostic mode, block 822 is performed. At block 822, the UE is corrected and the memory subsystem continues to operate. Block 822 can be applied when the system is running in a diagnostics mode, where after correcting the second error, storing the information in NVS 614 and halting, the system is turned back on again (in spite of the double failure) and operated for diagnostics and repair purposes. In addition, the diagnostics mode may have applications in production environments where actual system up-time is more important than exposure to triple errors (e.g., massive search systems where incorrect calculations are insignificant if they happen with a very low probability). As discussed previously, once the location of the failures contributing to the uncorrectable error condition are known, general techniques for implementing the required ECC decoder to correct for the second error (i.e., the UE) are known in the art.

In alternate exemplary embodiments, the data read from the memory devices when the CE occurred is stored along with the address of the CE at block 808. In addition, at block 810, the address of the UE and data that includes one or both of the syndrome bits and data read from the memory device when the UE occurred is stored in the storage device. At block 816, the read data related to the previous CE and the read data related to the UE are used to identify the failing memory element.

In further alternate exemplary embodiments, block 812 determines if a previous CE has occurred at the same address as the current UE. Only if a CE has occurred at the same address as the UE, are blocks 816-822 performed. If a CE has not occurred at the same address as the UE, then block 814 is performed.

Portions or all of the processing depicted in FIG. 8 may be implemented by ECC logic 616 that contains standard ECC processing for the memory controller 610 with extensions to implement the processing described herein to determine the location of a second byte error, or UE. In addition, the processing depicted in FIG. 8 may be implemented in hardware, software, or a combination of hardware and software.

In exemplary embodiments, portions or all of the processing depicted in FIG. 8 is implemented by a service processor 612 to allow the processing to take place when the memory controller 610 is not functional and/or to allow the processing to take place without impacting the performance of the standard ECC processing in the ECC logic 616. For example, the standard ECC processing in the ECC logic 616 may already detect errors and write information about errors (both CE and UE) to the NVS 614 (e.g., perform blocks 802, 808 and 810). When it detects an UE, the standard ECC processing may be modified to invoke the service processor 612 to perform the processing in FIG. 8 starting at block 812 to determine if a previous CE has occurred. If it has not, then control may return to the standard ECC processing to perform block 814. If a previous CE has occurred, then the service processor 612 executes blocks 816 through 822 (possibly by calling modules in the standard ECC processing if they apply). The previous example is just one of ways that the processing depicted in FIG. 8 may be split up across the ECC logic 616 and the service processor 612.

In further exemplary embodiments, upon completion of block 816 (or 810 or 822), the service processor, processor or memory controller may invoke one or more methods such as chip sparing, bit lane sparing, or other available methods to correct the persistent error(s) and/or the new error which contributed to the uncorrectable error condition, in an effort to prevent future UE events. Once the corrective actions are taken and verified, the stored information associated with the repaired failure(s) would be cleared and potentially stored in another region of the NVM for failure tracking and/or other reporting purposes unrelated to subsequent uncorrectable error handling.

Figure 9:
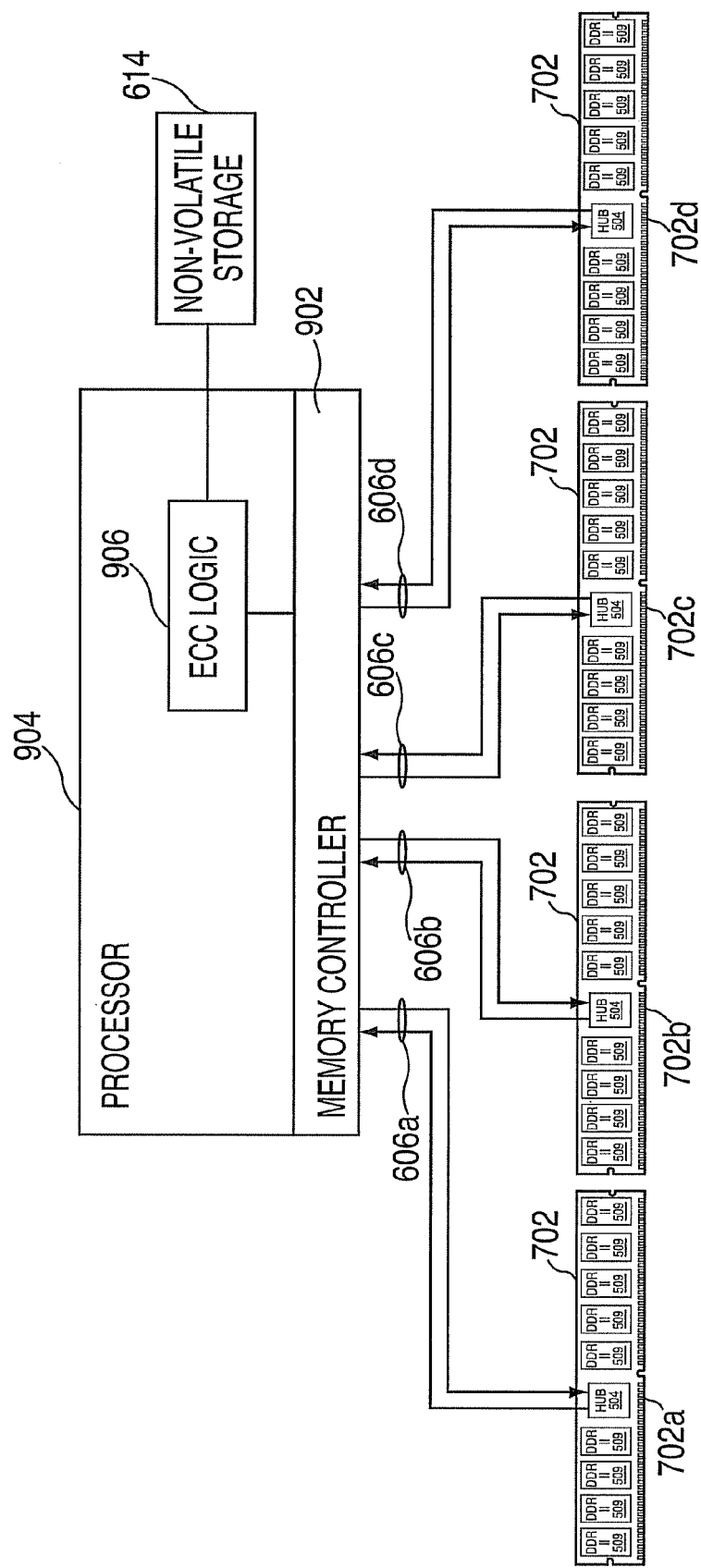
FIG. 9 depicts a memory structure with cascaded memory modules and unidirectional busses that may be utilized to implement exemplary embodiments of the present invention.

FIG. 9 depicts a memory structure with cascaded memory modules and unidirectional busses that may be utilized to implement exemplary embodiments of the present invention. The memory system depicted in FIG. 9 is similar to the system depicted in FIG. 7 except that all of the processing depicted in FIG. 8 is contained in the ECC logic block 906 and at least a portion of the ECC logic block 906 related to UE recovery (e.g. blocks 810 and above) is located in the processor 904. The information utilized by the processing depicted in FIG. 8 is stored in NVS 614.

The exemplary embodiment depicted in FIG. 9 includes a memory system with two or more memory modules 702 operating in unison in response to read requests from the memory controller 902. The memory modules 702, as depicted in FIG. 9 each include one or more memory devices. The memory system also includes a storage means (e.g., non-volatile storage 614 or other storage located in a processor 904 or ECC logic 906) for storing failure information associated with a first fail at an address. The memory system also includes a processor 904 (e.g., all or a subset of the processor 904 and/or the service processor 612 depicted in FIG. 6) for facilitating logic (contained for e.g., in the ECC logic block 906). The logic facilitates identifying a failing memory element (e.g., a memory device on a memory module 702 or a memory module 702) associated with the location of a UE.

An exemplary embodiment of the present invention described below herein includes a decoding procedure for correcting two errors where the location of the first error is known. Exemplary embodiments may be utilized to determine defective memory devices, DIMMs (or memory modules), etc., in a system where 4 DIMMs (or some other number of DIMMs), operating in unison, service any one line request. The code described below is capable of correcting any one byte error and detecting any two byte errors. When a persistent, CE is found, information about the CE is stored (e.g., address, location, data accessed, syndrome bits) and is subsequently used, in response to a UE, to locate and optionally to correct a second error which occurred in the same ECC word (e.g., memory access) with the persistent CE to result in an uncorrectable error condition. The information related to the second error is then used, in conjunction with the information related to the first error, to locate the one or more defective DIMM(s), or memory module 702.

The exemplary embodiment described below is implemented in hardware, however, for the purposes of the task above, it is in principle not necessary to implement this feature in the actual hardware; it will suffice to store the code's syndrome information along with the first error location in a non-volatile memory so that the information can be retrieved at repair time and then analyzed with a software tool. On the other hand, the exemplary embodiments that can determine the location of a UE error may be used to increase the actual error correction capacity of the system (with the caveat of the associated exposure to triple errors), in which case it may be preferred, e.g., for performance reasons, to implement it in hardware. Other implementation options exist: for example, it is feasible to provide the hardware with the functionality to find the location of the UE but not correct it.

In exemplary embodiments, the algorithm described below is used only when the standard ECC decoder for detecting double errors and correcting single errors signals that it has detected an UE. Those UEs consisting of exactly two errors will be corrected if the location of one of the errors is loaded in the appropriate input variable. This algorithm too will have an UE signal (the true one) in case the error cannot be corrected by it.

A Reed Solomon code for detecting two errors and correcting a single error generally utilizes an ECC parity check matrix or H-matrix to represent the parity-check equations that each ECC word must satisfy. The H-matrix is also used to specify the XOR logic for the generation of ECC check bits and syndrome bits. The result of the XOR of those bits of an ECC word corresponding to the ones in a row vector of the H-matrix is always equal to 0. Mathematically, if $\underline{V}$ is a binary vector representing an ECC word, then the product of the ECC matrix H and the transpose of $\underline{V}$ is an all zeros vector, i.e., $H \cdot \underline{V}^t = 0 \mod 2$. From the parity-check equations, the values of check bits can be calculated from the data bits through XOR operations. The data bits together with the corresponding check bits form an ECC word to be stored in the memory. On the other hand, when an ECC encoded word is fetched from the memory, the parity-check equations are used to generate the syndrome that represents the validity of the received data.

For example, let $p(x)=1+x+x^6+x^7+x^8$, a binary primitive polynomial, and $\alpha$ be a root of $p(x)$ in the finite field $GF(2^8)$ of 256 elements. The companion matrix of $\alpha$ is:

$$T = \begin{bmatrix} 0 & 0 & 0 & 0 & 0 & 0 & 0 & 1 \\ 1 & 0 & 0 & 0 & 0 & 0 & 0 & 1 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 1 \\ 0 & 0 & 0 & 0 & 0 & 0 & 1 & 1 \end{bmatrix}$$

Certain powers of T will be used to represent the elements of the ECC H-matrix. The powers $T^i$ are companion matrices of the non zero finite field elements $\alpha^i$, $0 \leq i \leq 254$. In addition, each $\alpha^i$ can be expressed as an 8-bit binary vector.

A (288, 264) SSC-DSD (single symbol error correcting—double symbol error detecting) code with 24 check bits (3 symbols) and 264 data bits (33 symbols) for a total of 288 bits (36 symbols) is constructed and specified by the H-matrix of the form:

$$H = [M_1 \ M_2 \ I_{24}],$$

where $M_1$ is $$\begin{vmatrix} I & I & I & I & I & I & I & I & I & I & I & I & T^2 & T^{49} & T^{50} & T^{51} & T^{227} \\ I & T & T^2 & T^3 & T^4 & T^{156} & T^{157} & T^{158} & T^{159} & T^{251} & T^{252} & T^{254} & I & I & I & I & I \\ T^{56} & T^{55} & T^{54} & T^{53} & T^{52} & T^{155} & T^{154} & T^{153} & T^{152} & T^{60} & T^{59} & T^{57} & T^{60} & T^{154} & T^{156} & T^{158} & I \end{vmatrix}$$

and $M_2$ is $$\begin{vmatrix} I & I & I & I & I & I & I & I & I & I & I & I & T^2 & T^{49} & T^{50} & T^{51} \\ T^{56} & T^{55} & T^{54} & T^{53} & T^{52} & T^{155} & T^{154} & T^{153} & T^{152} & T^{60} & T^{59} & T^{57} & T^{60} & T^{154} & T^{156} & T^{158} \\ I & T & T^2 & T^3 & T^4 & T^{156} & T^{157} & T^{158} & T^{159} & T^{251} & T^{252} & T^{254} & I & I & I & I \end{vmatrix}$$

I is an 8×8 identity matrix, $I_{24}$ is a 24×24 identity matrix. Note that the last two rows of $M_2$ are a permutation of the last two rows of the first 16 columns of $M_1$. This property may be used for modular implementation in syndrome generation and in syndrome decoding.

In exemplary embodiments, the first 33 symbol positions of an ECC word are designated as the data symbols and last 3 symbol positions are designated as the check symbols. The H-matrix can also be represented as $H=[H_1, H_2, \ldots, H_{36}]$, where each $H_i$ is a 24×8 binary matrix and will be call a symbol column. Note that each symbol column consists of three 8×8 sub-matrices, one of which is an identity matrix. This property is designed so that a symbol error pattern can be easily identified in syndrome decoding. All 8 bits in the same symbol are assumed to be stored in the same memory array chip.

Being an SSC-DSD code, the H-matrix described previously has the following properties: (1) the column vectors of each symbol column are linearly independent; (2) the dimension of the space spanned by the column vectors of any two symbol columns is 16; and (3) the dimension of the space spanned by the column vectors of any three symbol columns is 24.

If the number of data bits k is less than 264, the ECC can be shortened by deleting some binary columns from the data portion of the H-matrix. For example, if the number of data bits is k=256, the last symbol column (consisting of 8 binary columns) of $M_1$ may be deleted from the H-matrix to form a (280, 256) SSC-DSD code. If the number of data bits is k=260, bit positions 3, 4, 7, 8 of the last symbol column of $M_1$ may be deleted from the H-matrix to form a (284, 260) SSC-DSD code.

When an ECC encoded data W is received, the data is checked to see if the syndrome, $S = H \cdot W^t$, is an all zeros vector. If S is an all zeros vector, it is assumed that there is no error in W. Otherwise, S is decoded to determine if the errors in W is correctable and to determine the locations of errors. In exemplary embodiments described herein, a syndrome S is divided into 3 components $S_1$, $S_2$, and $S_3$ so that $S=(S_1, S_2, S_3)$. Each of the components is an 8-bit binary vector and may be considered an element of $GF(2^8)$.

In the example below, $E_i$ is the error pattern at symbol position i and $L_i$ is the symbol error indicator for symbol i. The value of $L_i$ is one if and only if symbol i is in error. In addition, $\underline{V}$ is an encoded ECC word that satisfies the equation $H \cdot \underline{V}^t = 0 \mod 2$, and $W = \underline{V} + \underline{E} \pmod 2$ is a corrupted word of $\underline{V}$ by the error vector $\underline{E} = (E_1, E_2, \ldots, E_{36})$. Once the error vector $\underline{E}$ is determined from decoding the syndrome, the original vector $\underline{V}$ is recovered by setting $\underline{V} = W + \underline{E} \pmod 2$. Thus, from the equation $H \cdot \underline{V}^t = 0 \mod 2$, the syndrome S is:

$$S = H \cdot W^t = H \cdot (\underline{V}^t + \underline{E}^t) = H \cdot \underline{E}^t \mod 2$$

Furthermore, if the error vector consists of a single symbol error at position i then:

$$S = H_i \cdot E_i^t \mod 2$$

For example, if i=13, the syndrome is:

$$S = \begin{bmatrix} T^2 \\ I \\ T^{60} \end{bmatrix} \cdot E_i^t \bmod 2$$

In this case, $S_1=T^2 \cdot E_i^t$, $S_2=E_i^t$, $S_3=T^{60} \cdot E_i^t$. Thus, if $S_1=T^2 \cdot S_2$ and $S_3=T^{60} \cdot S_2$, we set $L_{13}=1$, and $E_{13}=S_2^t$. All symbol error indicators can be generated in a similar way. If the syndrome is non-zero and none of the symbol indicators generated in this fashion turns on, then the UE signal is turned on. This method of syndrome decoding is a known state-of-the-art.

Under the assumption that the standard ECC decoder has raised an UE flag, then it is known that more than one error has occurred. The algorithm below assumes that exactly two errors have occurred, the first of which has known location (e.g., is a persistent CE). Throughout the example below, the index i identifies the known location of the first error (i.e., the CE) and the index j identifies the unknown location of a second error (i.e., the UE). Regardless of the value of i and j, it is always true that the values for the syndromes are as follows:

$$S_1 = H_{1,i} E_i + H_{1,j} E_j; \quad (1)$$

$$S_2 = H_{2,i} E_i + H_{2,j} E_j; \quad (2) \text{ and}$$

$$S_3 = H_{3,i} E_i + H_{3,j} E_j; \quad (3)$$

where $E_i$ and $E_j$ are the error magnitudes and they are (by assumption) nonzero. The ratios $H_{2,k}/H_{1,k}$, $H_{3,k}/H_{2,k}$ and $H_{3,k}/H_{1,k}$ for k in $\{1, \ldots, 33\}$ are key to the decoding feature under discussion. The following tables show them explicitly: for $M_1$ they are:

| $H_{3,}$ | $T^{56}$ | $T^{54}$ | $T^{52}$ | $T^{50}$ | $T^{48}$ | $T^{254}$ | $T^{252}$ | $T^{250}$ | $T^{248}$ | $T^{64}$ | $T^{62}$ | $T^{58}$ | $T^{60}$ | $T^{154}$ | $T^{156}$ | $T^{158}$ | $I$ |
|---|---|---|---|---|---|---|---|---|---|---|---|---|---|---|---|---|---|
| $H_{2,}$ | $I$ | $T$ | $T^2$ | $T^3$ | $T^4$ | $T^{156}$ | $T^{157}$ | $T^{158}$ | $T^{159}$ | $T^{251}$ | $T^{252}$ | $T^{254}$ | $T^{253}$ | $T^{206}$ | $T^{205}$ | $T^{204}$ | $T^{28}$ |
| $H_{3,}$ | $T^{56}$ | $T^{55}$ | $T^{54}$ | $T^{53}$ | $T^{52}$ | $T^{155}$ | $T^{154}$ | $T^{153}$ | $T^{152}$ | $T^{60}$ | $T^{59}$ | $T^{57}$ | $T^{58}$ | $T^{105}$ | $T^{106}$ | $T^{107}$ | $T^{28}$ | and for $M_2$ they are:

| $H_{3,k}/H_{2,k}$ | $T^{199}$ | $T^{201}$ | $T^{203}$ | $T^{205}$ | $T^{207}$ | $T^1$ | $T^3$ | $T^5$ | $T^7$ | $T^{191}$ | $T^{193}$ | $T^{197}$ | $T^{195}$ | $T^{101}$ | $T^{99}$ | $T^{97}$ |
|---|---|---|---|---|---|---|---|---|---|---|---|---|---|---|---|---|
| $H_{2,k}/H_{1,k}$ | $T^{56}$ | $T^{55}$ | $T^{54}$ | $T^{53}$ | $T^{52}$ | $T^{155}$ | $T^{154}$ | $T^{153}$ | $T^{152}$ | $T^{60}$ | $T^{59}$ | $T^{57}$ | $T^{58}$ | $T^{105}$ | $T^{106}$ | $T^{107}$ |
| $H_{3,k}/H_{1,k}$ | $I$ | $T$ | $T^2$ | $T^3$ | $T^4$ | $T^{156}$ | $T^{157}$ | $T^{158}$ | $T^{159}$ | $T^{251}$ | $T^{252}$ | $T^{254}$ | $T^{253}$ | $T^{206}$ | $T^{205}$ | $T^{204}$ |

The primary property of interest is that if r and s are in $\{1, \ldots, 33\}$ then:
- $H_{3,r}/H_{2,r}$ is different from $H_{3,s}/H_{2,s}$
- $H_{2,r}/H_{1,r}$ is different from $H_{2,s}/H_{1,s}$
- $H_{3,r}/H_{1,r}$ is different from $H_{3,s}/H_{1,s}$.

This can be seen by direct examination of the tables shown before.

Case 1. The first error has known location i in $\{34, 35, 36\}$. It is assumed that i=34. Then we know that $H_{i,2}=H_{i,3}=0$, and therefore formulas (1, 2, 3) translate to:

$$S_1 = E_i + H_{1,j} E_j; \quad (4)$$

$$S_2 = H_{2,j} E_j; \text{ and} \quad (5)$$

$$S_3 = H_{3,j} E_j. \quad (6)$$

Figure 10:
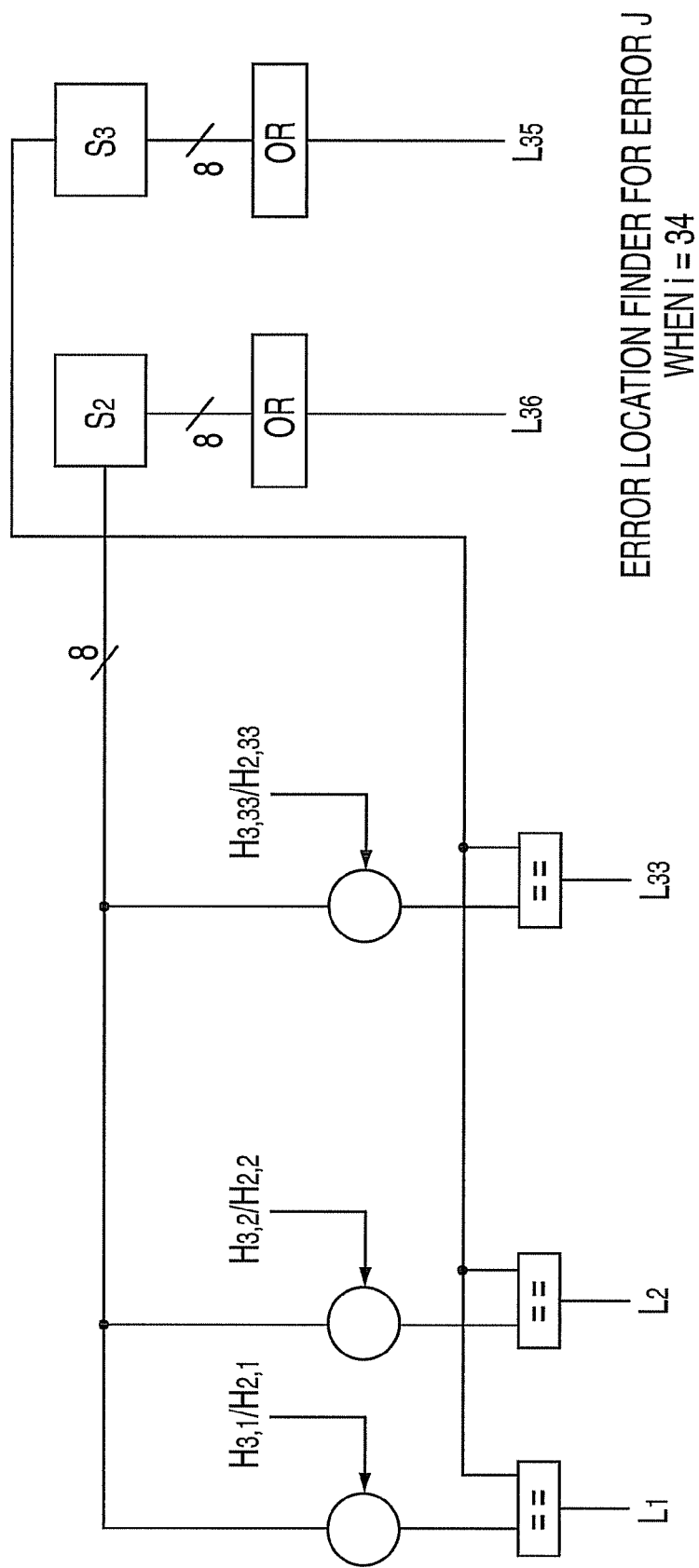
FIGS. 10-13 depict exemplary circuits that may be implemented by exemplary embodiments of the present invention.
Figure 11:
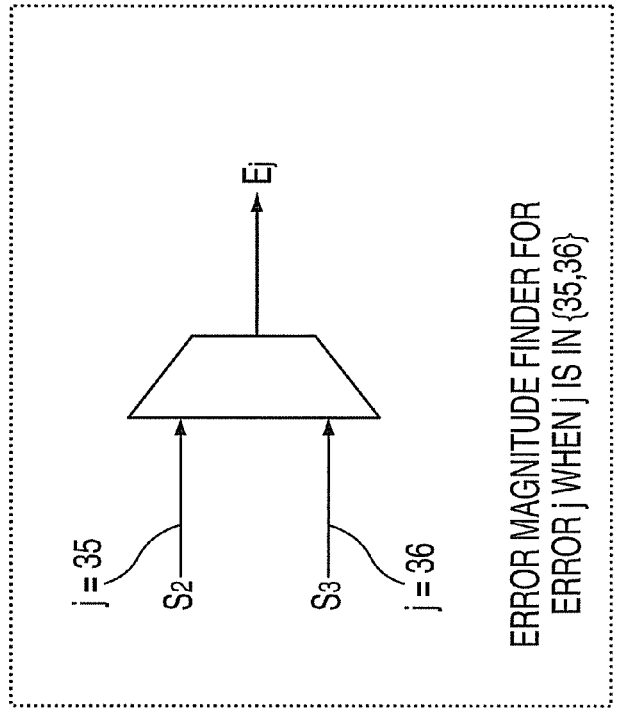
Figure 11:
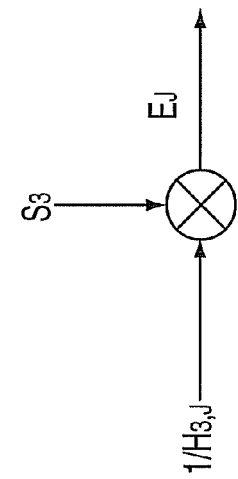
Figure 11:
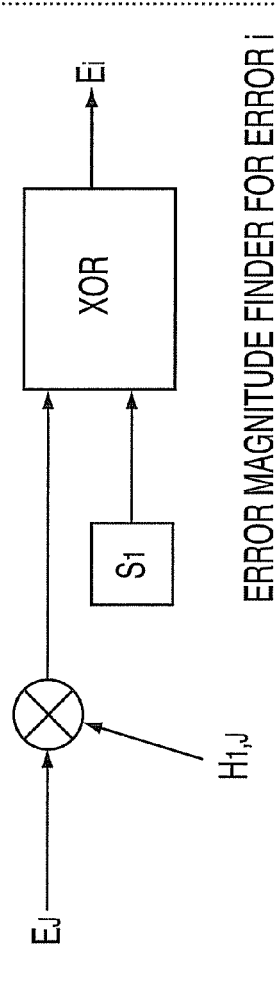

If j=35 then $S_3=0$ and $S_2=E_j$ and if j=36 then $S_2=0$ and $S_3=E_j$. On the other hand, if j is in $\{1, \ldots, 33\}$ then neither $S_2$ nor $S_3$ can be equal to zero (because $H_{2,j}$ and $H_{3,j}$ are both nonzero). Multiplying $S_2$ by $H_{3,j}/H_{2,j}$ results in $S_3$. Furthermore, for any other k in $\{1, \ldots, 33\}$ but not equal to j, $H_{3,k}/H_{2,k}$ is different from $H_{3,j}/H_{2,j}$ (this was observed at the beginning of this section). Therefore the following circuit depicted in FIG. 10 would find j in the particular situation where i=34 (in the circuit, all of the output signals Lx are equal to 1 except for Lj=0 and the equality ("=") circuit gives 0 if true and 1 otherwise). Upon finding the value of j, one must compute the error magnitudes Ei, Ej. Circuits for computing these can be found in FIG. 11. Similar schematics can be deduced for the cases when i=35 and i=36.

Case 2. The first error has known location i in $\{1, \ldots, 33\}$

Dividing by $H_{1,i}$, $H_{2,i}$ and $H_{3,i}$ (which are nonzero by assumption) results in:

$$S_1/H_{1,i} = E_i + (H_{1,j}/H_{1,i}) E_j; \quad (7)$$

$$S_2/H_{2,i} = E_i + (H_{2,j}/H_{2,i}) E_j; \text{ and} \quad (8)$$

$$S_3/H_{3,i} = E_i + (H_{3,j}/H_{3,i}) E_j. \quad (9)$$

The addition operation in this field is simply an XOR operation and thus addition and subtraction are identical operations. By choosing two out of three in (7, 8, 9) (a total of three possibilities) and adding the chosen equations results in:

$$A_{1+2} = S_1/H_{1,i} + S_2/H_{2,i} = (H_{1,j}/H_{1,i} + H_{2,j}/H_{2,i}) E_j; \quad (10)$$

$$A_{2+3} = S_2/H_{2,i} + S_3/H_{3,i} = (H_{2,j}/H_{2,i} + H_{3,j}/H_{3,i}) E_j; \text{ and} \quad (11)$$

$$A_{1+3} = S_1/H_{1,i} + S_3/H_{3,i} = (H_{1,j}/H_{1,i} + H_{3,j}/H_{3,i}) E_j. \quad (12)$$

If j is in $\{34, 35, 36\}$ then exactly one of the above will be zero. Furthermore, if j is in $\{1, \ldots, 33\}$, then none of $A_{1+2}$, $A_{2+3}$, $A_{1+3}$ can be equal to zero; this can be seen from the properties that we derived of the check matrix H at the beginning of this discussion. Assume that j=34. Then $H_{2,j}=H_{3,j}=0$ and therefore $A_{2+3}=0$. Moreover, $A_{1+2}=A_{1+3}=E_j/H_{1,j}$. A similar analysis for the cases j=35 and j=36 yields the following table.

| i in $\{1, \ldots, 33\}$ | $A_{1+2}$ | $A_{2+3}$ | $A_{1+3}$ |
|---|---|---|---|
| j = 34 | $E_j/H_{1,i}$ | 0 | $E_j/H_{1,i}$ |
| j = 35 | $E_j/H_{2,i}$ | $E_j/H_{2,i}$ | 0 |
| j = 36 | 0 | $E_j/H_{3,i}$ | $E_j/H_{3,i}$ |

Note that if j is in $\{1, \ldots, 33\}$ and $A_{1+2}=0$, then $H_{1,j}/H_{1,i}=H_{2,j}/H_{2,i}$. Manipulating this, results in $H_{2,j}/H_{1,j}=H_{2,i}/H_{2,j}$ and since by assumption i is different from j, from the properties of H described at the beginning of this section results in a contradiction. Similarly if $A_{2+3}=0$ then $H_{3,j}/H_{2,j}=H_{3,i}/H_{2,i}$ and if $A_{1+3}=0$ then $H_{3,j}/H_{1,j}=H_{3,i}/H_{1,i}$, results in similar contradictions.

The discussion above implies that the existence of one zero in $(A_{1+2}, A_{2+3}, A_{1+3})$ can be used in order to discriminate between the cases where j is in $\{1, \ldots, 33\}$ and j is in $\{34, 35, 36\}$. Furthermore in the case where j is in $\{34, 35, 36\}$, the table above immediately gives a technique to find j, $E_j$ and through (1, 2, 3), $E_i$.

It remains how to decode when j is in $\{1, \ldots, 33\}$. By direct examination of the parity check matrix H it can be deduced that for every index k in the set $\{1, \ldots, 33\}$, the parity check matrix satisfies: $H_{2,k} H_{3,k}=T^{56} (H_{1,k})^2$. Forming the ratio $A_{2+3}/A_{1+2}$, using the above to replace $H_{3,i}$ and $H_{3,j}$ and simplifying the resulting expression results in:

$$A_{2+3}/A_{1+2} = 1 + \frac{H_{1,j}/H_{2,j}}{H_{1,i}/H_{2,i}}. \quad (13)$$

The ratio $H_{1,i}/H_{2,i}$ is known and the left hand side of the equation above is known, thus it may be solved for $H_{1,j}/H_{2,j}$ via:

$$H_{1,j}/H_{2,j}=(A_{2+3}/A_{1+2}+1)(H_{1,i}/H_{2,i})$$

In order to find the error location j, the unique values of j much be identified such that the equation above is satisfied. The uniqueness follows from the properties of H discussed previously. Having found the error location j, the error magnitudes are found by the following:

$$\begin{bmatrix} E_i \\ E_j \end{bmatrix} = \frac{1}{H_{1,i}H_{2,j} + H_{1,j}H_{2,i}} \begin{bmatrix} H_{2,j} & H_{1,j} \\ H_{2,i} & H_{1,i} \end{bmatrix} \begin{bmatrix} S_1 \\ S_2 \end{bmatrix} \quad (14)$$

Figure 12:
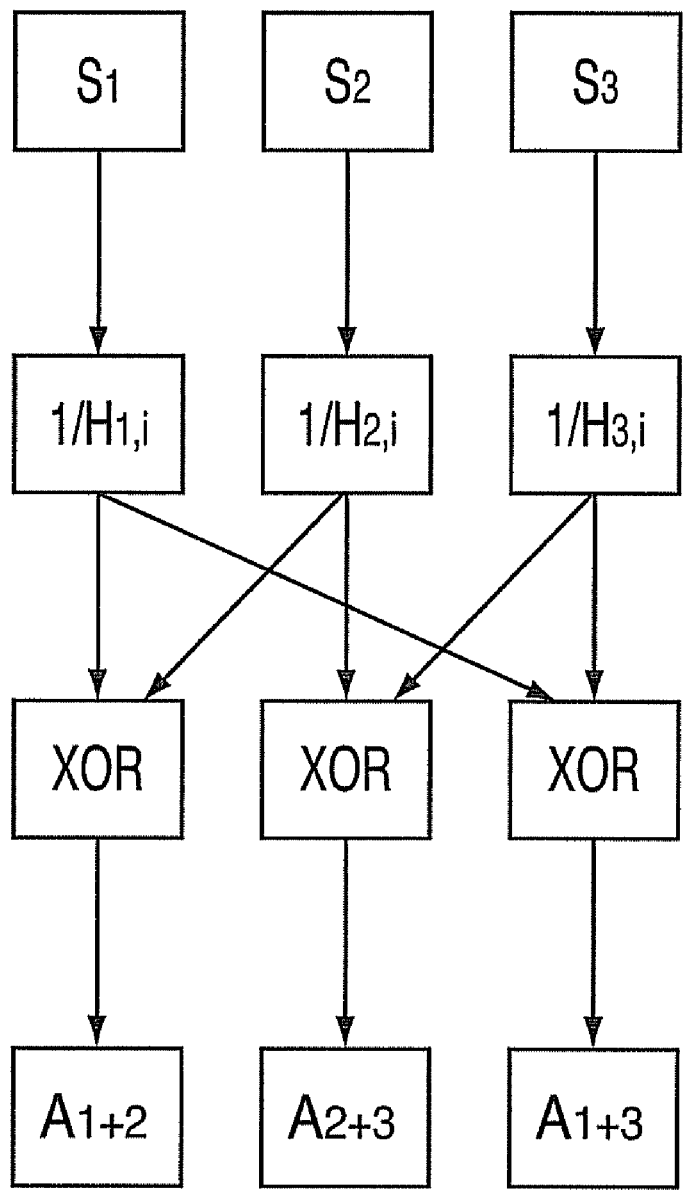
Figure 13:
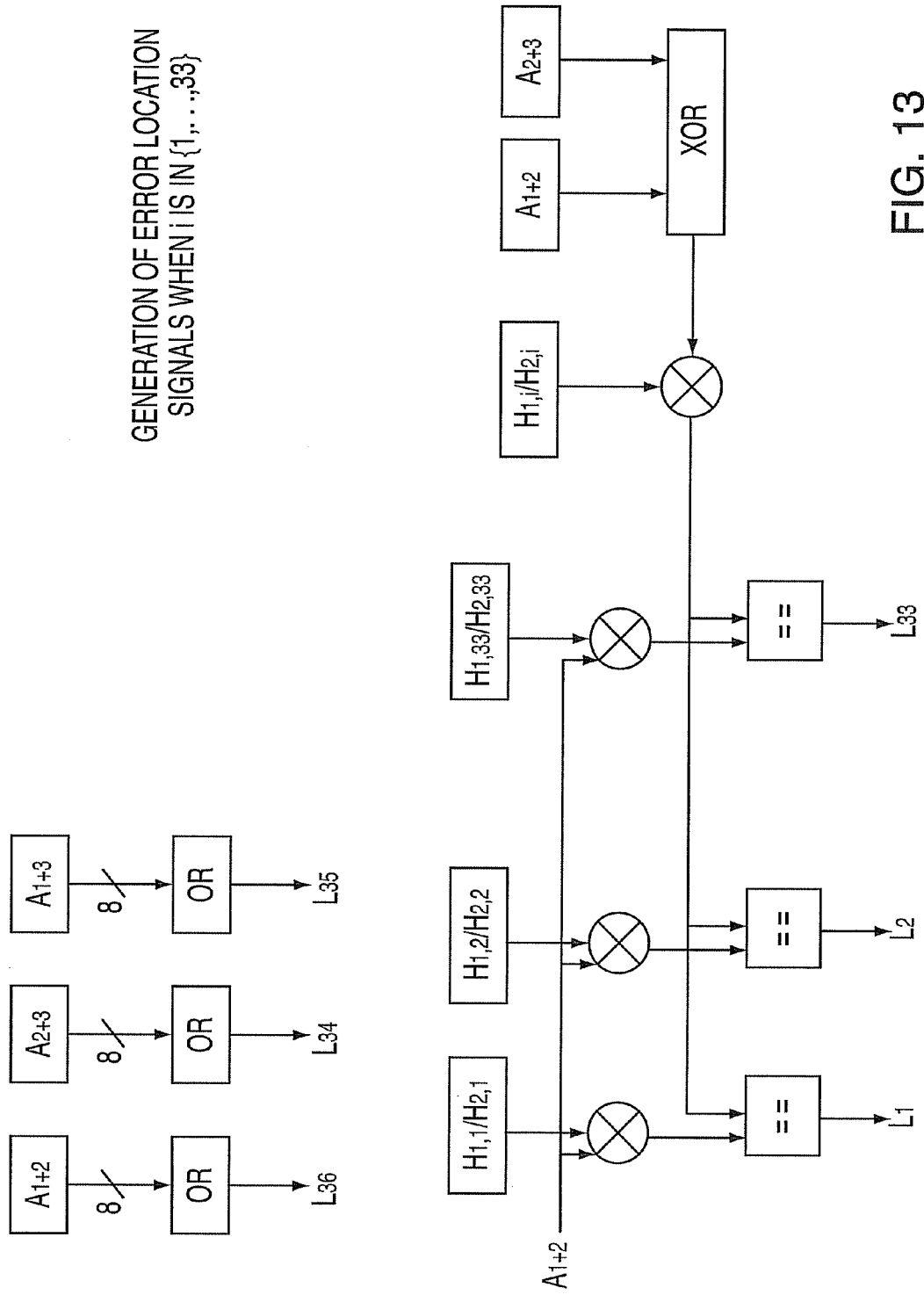

FIGS. 12 and 13 depict the calculation of $A_{1+2}$, $A_{2+3}$ and $A_{1+3}$ together with the error location algorithm as a circuit schematic.

The above demonstrates one set of computations that can be carried out by exemplary embodiments in order to correct two errors, the first of which is in a known location. For implementation considerations, it desirable to avoid the task of implementing a Galois field division circuit that will divide a Galois field element by an arbitrary element.

The task of forming $A_{1+2}$ and $A_{2+3}$ can be accomplished by computing in parallel for every k in $\{1, \ldots, 33\}$ the three quantities $S_1/H_{1,k}$, $S_2/H_{2,k}$ and $S_3/H_{3,k}$, and then selecting the correct computation using a multiplexer whose input is i, the known location for the error. Since the elements $H_{1,k}$, $H_{2,k}$ and $H_{3,k}$ are known in advance, their inverses can be pre-computed and the task above can be turned into a multiplication.

In order to avoid computing $A_{2+3}/A_{1+2}$ note that it must be true that:

$$(H_{1,j}/H_{2,j})A_{1+2}=(A_{1+2}+A_{2+3})(H_{1,i}/H_{2,i}).$$

To find the unique value of j for which the above holds, the products $(H_{1,k}/H_{2,k})A_{1+2}$ are formed in parallel for every k in $\{1, \ldots, 33\}$ and a check is made for equality with the right hand side. The factor $(H_{1,i}/H_{2,i})$ is obtained by using a multiplexer with hard-wired inputs and selector i.

One Galois field inversion still remains for the computation of the error magnitudes in (18) (after the computation of this inversion, the result can be shared to compute both $E_i$ and $E_j$). In exemplary embodiments, the denominator $H_{1,i} H_{2,j}+H_{1,j} H_2$, is computed and then the result is inverted via a memory with 256 8-bit entries.

Exemplary embodiments include a computing system with a processor(s) and an I/O unit(s) (e.g., requestors) interconnected to a memory system that contains a memory controller and memory devices. In exemplary embodiments, the memory system includes a processor or memory controller interfaced to a set of hub devices (also referred to as "hub chips"). The hub devices connect and interface to the memory devices. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g., a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

Figure 1:
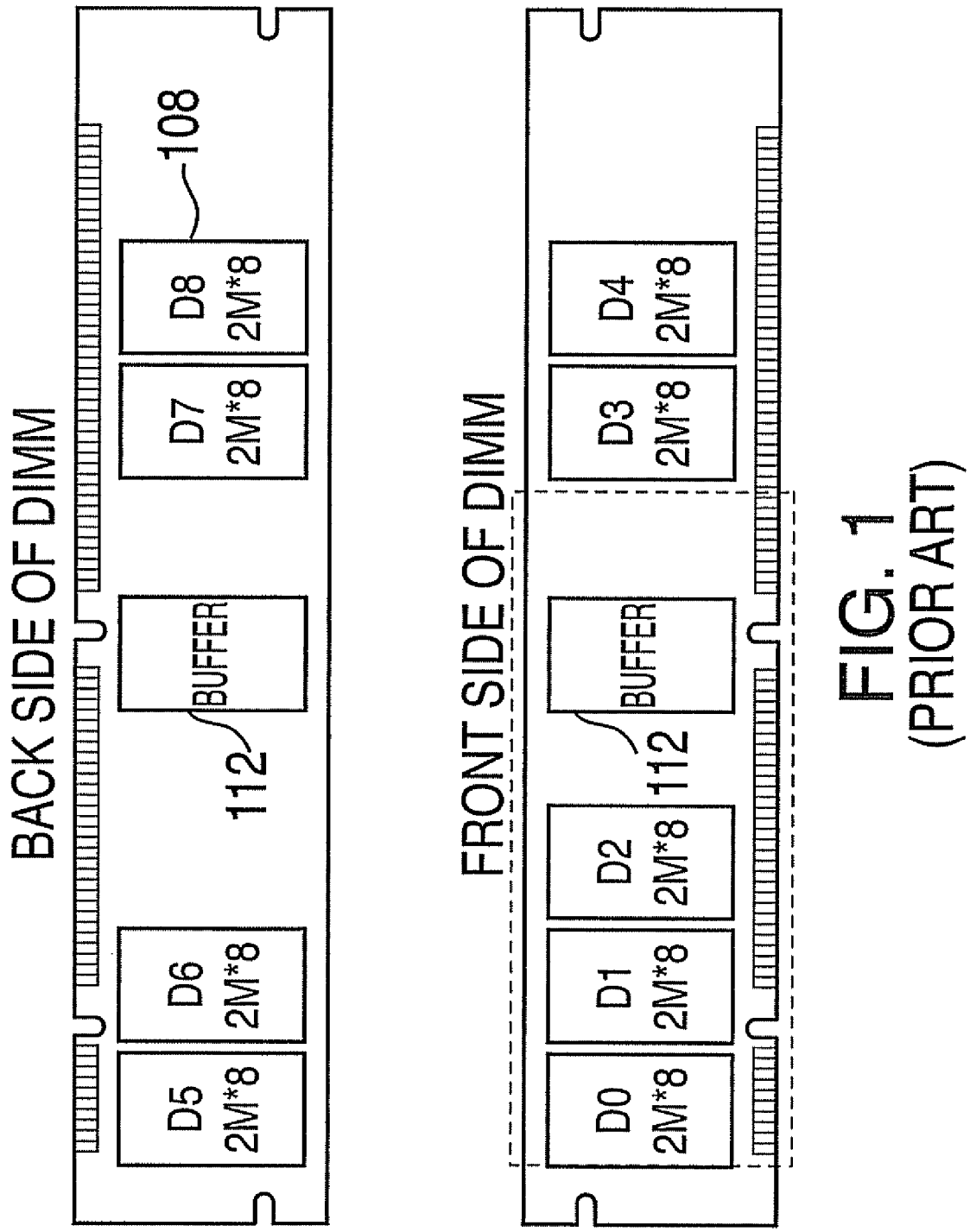
FIG. 1 depicts an exemplary early synchronous memory module.
Figure 2:
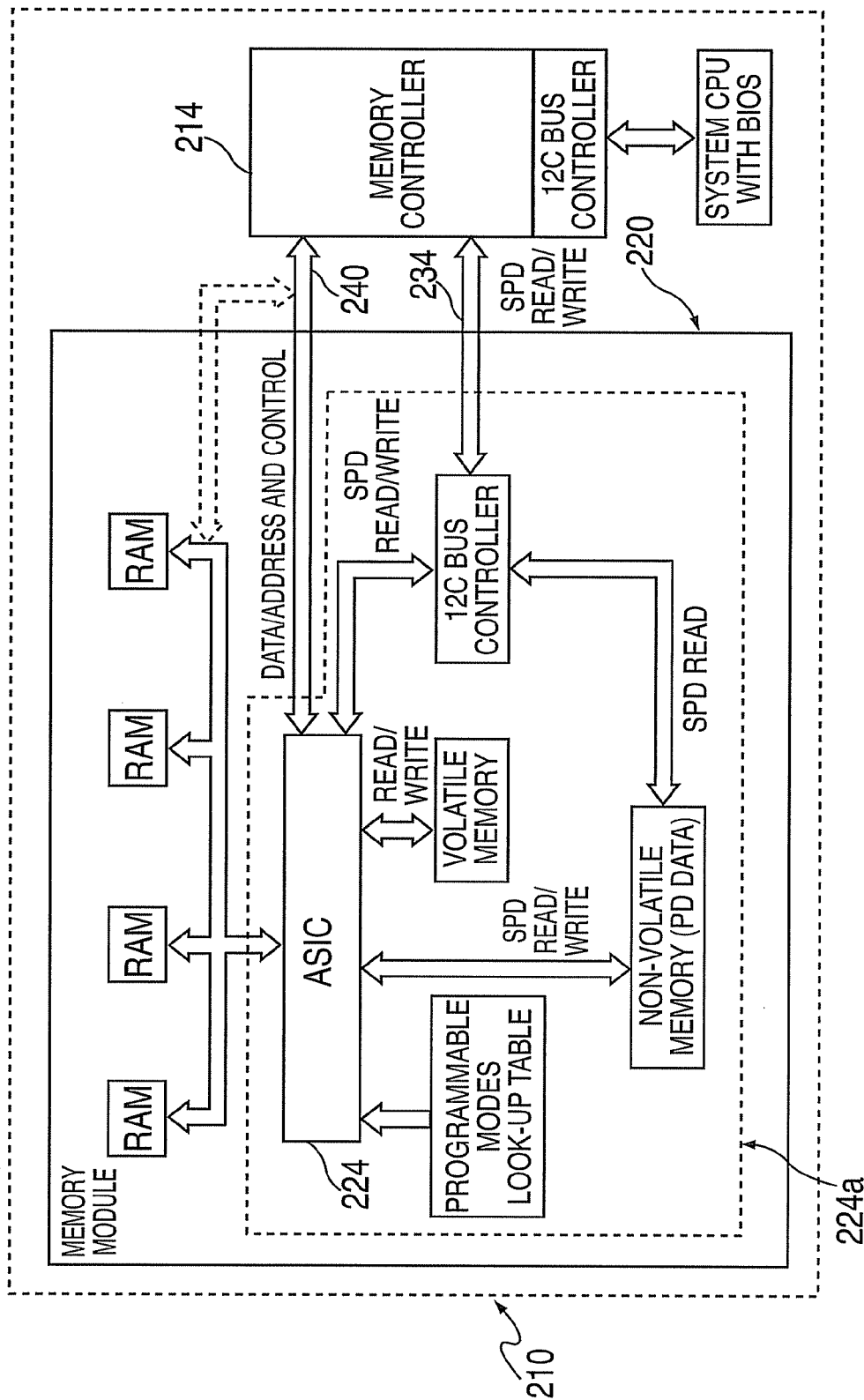
FIG. 2 depicts an exemplary computer system with a fully buffered synchronous memory module that is directly connected to a memory controller.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. The DIMM depicted in FIG. 1 includes 168 pins in the exemplary embodiment, whereas subsequent DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g., packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits of exemplary embodiments include the ability to identify a failing memory module in a memory system. This may lead to a reduction in materials cost because all of the memory modules in the system will not have to be replaced when only one is in need of repair. In addition, this should result in minimizing the downtime of the memory system and increasing the probability that the failure has been resolved.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method for identifying a failing memory element in a memory system when two or more memory modules operate in unison in response to a read request, the method comprising:
   receiving syndrome bits associated with one symbol correcting code error correction code (ECC) word, the syndrome bits indicating an uncorrectable error (UE); and
   in response to one or more previous correctable errors (CEs) having occurred:
      retrieving the location of a previous CE, the location of the previous CE specifying a memory module and an address;
      determining a location of the UE using the location of the previous CE as input to the determining, the location of the UE specifying a memory device position; and
      identifying a failing memory element associated with the location of the UE.

2. The method of claim 1 wherein the failing memory element is a memory device.

3. The method of claim 1 wherein the failing memory element is a memory module.

4. The method of claim 1 further comprising correcting the data read at the location of the UE.

5. The method of claim 1 wherein one or more of the receiving, retrieving, determining, and identifying is performed by a service processor.

6. The method of claim 1 wherein the location of the previous CE is retrieved from non-volatile storage.

7. The method of claim 1 further comprising performing one or more of activating a visual indicator identifying the failing memory element and generating a report indicating the failing memory element.

8. The method of claim 1 further comprising determining the magnitude of one or both of the CE and the UE.

9. The method of claim 1 wherein the retrieving, determining and identifying are performed in response to the previous CE having occurred at the same address range as the address range of the UE, the address range comprised of at least the address included in the location of the previous CE.

10. A method for identifying a failing memory element in a memory system where two or more memory modules operate in unison in response to a read request, the method comprising:
   receiving an address associated with an uncorrectable error (UL) and data related to the UE including one or more of syndrome bits associated with one symbol correcting code error correction code (ECC) word and read data; and
   in response to one or more previous correctable errors (CEs) having occurred:
      retrieving read data related to a previous CE; and
      identifying a failing memory element using the read data related to the previous CE and the data related to the UE as input to the identifying.

11. The method of claim 10 wherein the failing memory element is one or more of a memory device and a memory module.

12. The method of claim 10 further comprising correcting the data read at the location of the UE.

13. The method of claim 10 wherein one or more of the receiving, retrieving, and identifying is performed by a service processor.

14. The method of claim 10 wherein the location of the previous CE is retrieved from non-volatile storage.

15. The method of claim 10 further comprising performing one or more of activating a visual indicator identifying the failing memory element and generating a report indicating the failing memory element.

16. The method of claim 10 wherein the retrieving and identifying are performed in response to the previous CE having occurred at the same address range as the address range of the UE, the address range comprised of at least one address.

17. A memory system for identifying a failing memory element, the memory system comprising:
   two or more memory modules operating in unison in response to read requests, each memory module including one or more memory devices; and
   storage means for storing failure information associated with a first fail at an address; and
   a processor including logic for facilitating:
      receiving syndrome bits associated with one symbol correcting code error correction code (ECC) word, the syndrome bits indicating an uncorrectable error (UL); and
      in response to one or more previous correctable errors (CEs) having occurred:
         retrieving the location of a previous CE, the location of the previous CE specifying a memory module and an address;
         determining a location of the UE using the location of the previous CE as input to the determining, the location specifying a memory device position; and
         identifying a failing memory element associated with the location of the UE.

18. The memory system of claim 17 wherein the retrieving, determining and identifying are performed in response to the previous CE having occurred at the same address range as the address range of the UE, the address range comprising at least one address.

19. The memory system of claim 17 wherein the logic is implemented in one or more of hardware and software.

20. The memory system of claim 17 wherein the logic further enables correcting up to a byte of data read at the location of the UE in response to determining the location of the UE.

* * * * *